US009368508B2

(12) United States Patent
Jee et al.

(10) Patent No.: US 9,368,508 B2
(45) Date of Patent: Jun. 14, 2016

(54) MEMORY DEVICE

(71) Applicants: Jung Geun Jee, Seoul (KR); Dong Kyum Kim, Suwon-si (KR); Jin Gyun Kim, Suwon-si (KR); Ki Hyun Hwang, Seongnam-si (KR)

(72) Inventors: Jung Geun Jee, Seoul (KR); Dong Kyum Kim, Suwon-si (KR); Jin Gyun Kim, Suwon-si (KR); Ki Hyun Hwang, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/593,077

(22) Filed: Jan. 9, 2015

(65) Prior Publication Data
US 2015/0372000 A1    Dec. 24, 2015

(30) Foreign Application Priority Data
Jun. 24, 2014  (KR) .................. 10-2014-0077241

(51) Int. Cl.
*H01L 27/115* (2006.01)
*H01L 29/16* (2006.01)
*H01L 29/788* (2006.01)
*H01L 29/792* (2006.01)

(52) U.S. Cl.
CPC .... *H01L 27/11573* (2013.01); *H01L 27/11521* (2013.01); *H01L 27/11526* (2013.01); *H01L 27/11568* (2013.01); *H01L 29/16* (2013.01); *H01L 29/788* (2013.01); *H01L 29/792* (2013.01)

(58) Field of Classification Search
CPC ............... H01L 27/1157; H01L 27/11582; H01L 27/11573; H01L 29/788; H01L 29/16; H01L 27/11526; H01L 27/11521; H01L 27/11568; H01L 29/792
See application file for complete search history.

(56) References Cited

U.S. PATENT DOCUMENTS

| 6,610,996 | B2 | 8/2003 | Yamazaki et al. |
| 7,820,466 | B2 | 10/2010 | Jo et al. |
| 7,982,221 | B2 | 7/2011 | Han et al. |
| 2008/0135851 | A1 | 6/2008 | Kim et al. |
| 2009/0121271 | A1* | 5/2009 | Son et al. ........... 257/315 |
| 2011/0141821 | A1 | 6/2011 | Izumi et al. |
| 2011/0220987 | A1 | 9/2011 | Tanaka et al. |
| 2013/0045589 | A1 | 2/2013 | Kim et al. |
| 2014/0264926 | A1* | 9/2014 | Wu et al. ........... 257/774 |

FOREIGN PATENT DOCUMENTS

| JP | 09-266313 A | 10/1997 |
| JP | 11-026712 A | 1/1999 |
| JP | 2004-128345 A | 4/2004 |
| KR | 10-2010-0036450 A | 4/2010 |
| KR | 10-2013-0020221 A | 2/2013 |
| KR | 10-1309174 B1 | 9/2013 |

* cited by examiner

Primary Examiner — Latanya N Crawford
(74) Attorney, Agent, or Firm — Lee & Morse, P.C.

(57) ABSTRACT

There is provided a peripheral circuit region including a plurality of circuit elements disposed on a first substrate; and a cell region including at least one channel region extending from an upper surface of a second substrate disposed on the first substrate in a direction perpendicular to the upper surface of the second substrate, and a plurality of gate electrode layers and a plurality of insulating layers stacked on the second substrate to be adjacent to the at least one channel region, wherein at least a portion of the first substrate contacts the second substrate, and the first substrate and the second substrate provide a single substrate.

13 Claims, 27 Drawing Sheets

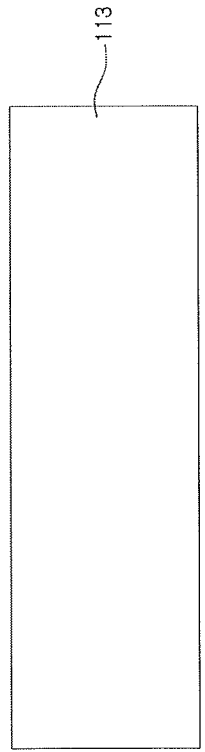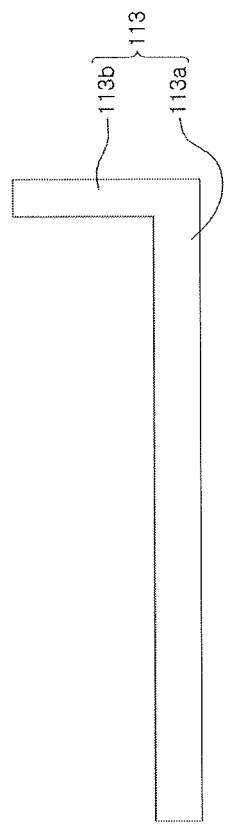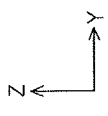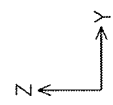
FIG. 8A
FIG. 8B

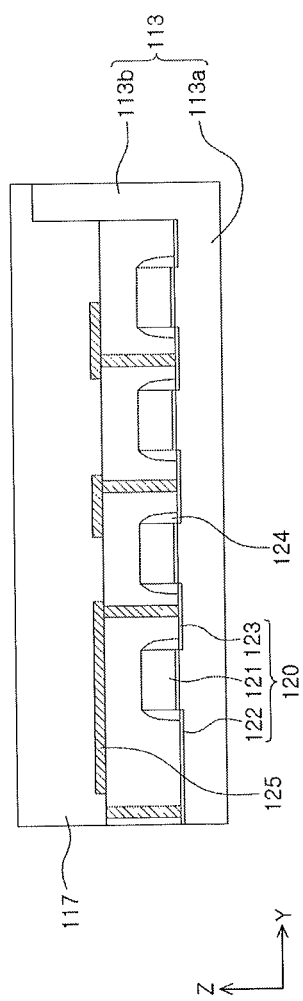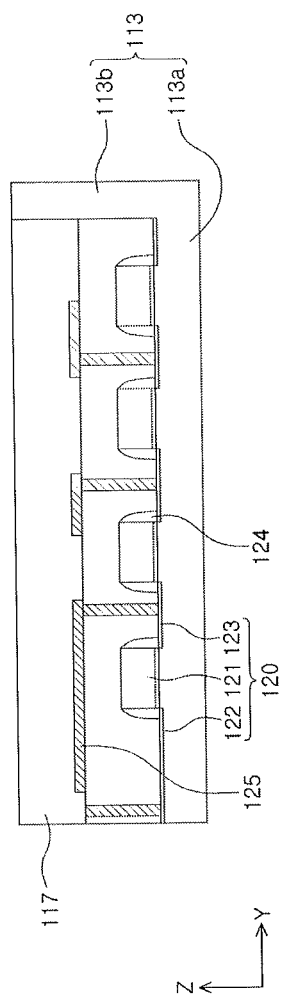

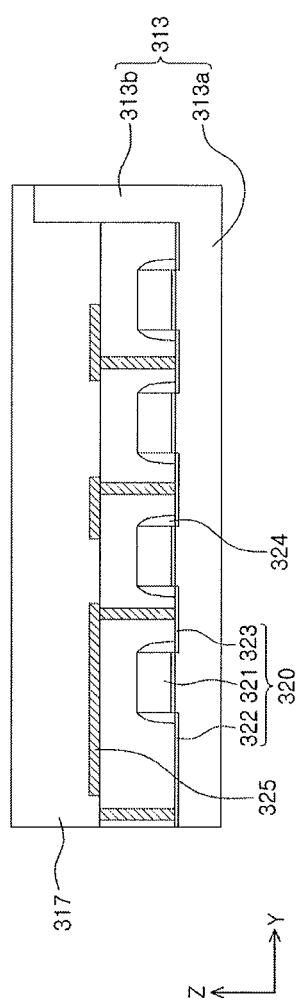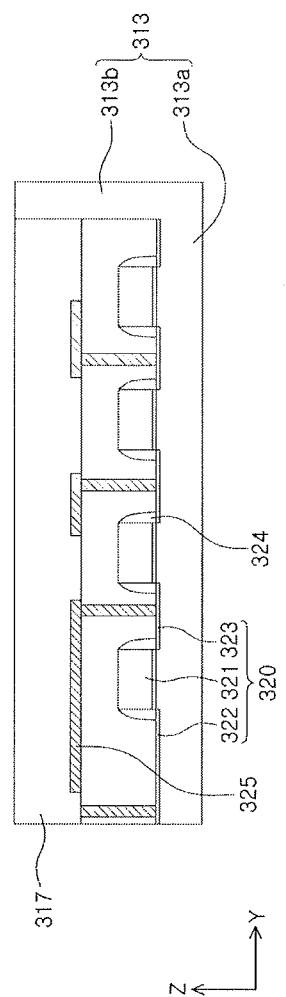

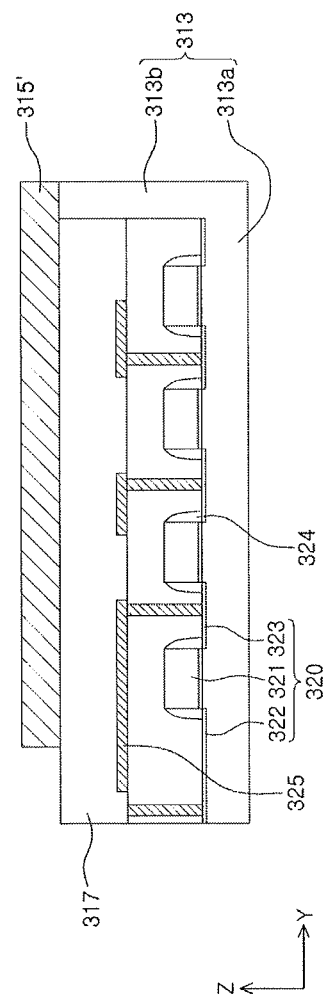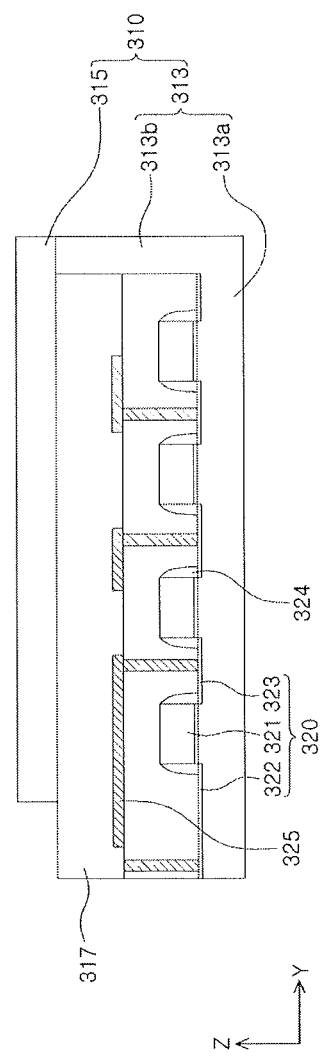

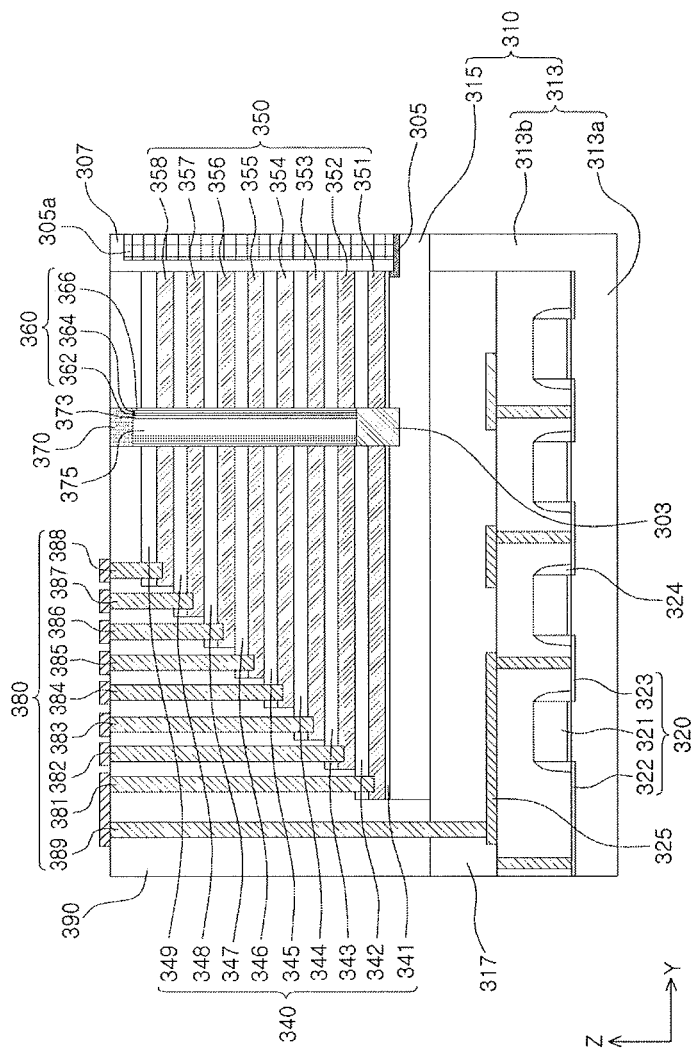

MEMORY DEVICE

CROSS-REFERENCE TO RELATED APPLICATION

This application claims priority to Korean Patent Application No. 10-2014-0077241 filed on Jun. 24, 2014, with the Korean Intellectual Property Office, the disclosure of which is incorporated herein by reference.

BACKGROUND

1. Field

The present disclosure relates to a memory device.

2. Description of the Related Art

Electronic products have been miniaturized, while still requiring the ability to process high capacity data. Thus, there is a need to enhance the degree of integration of semiconductor memory devices used in electronic products. As a method for enhancing the integration of such semiconductor memory devices, research is actively on-going with respect to memory devices, each having a cell region and a peripheral circuit region formed in different regions in a direction perpendicular to a substrate.

SUMMARY

An aspect of the present disclosure may provide a memory device having a high degree of integration by allowing a cell region and a peripheral circuit region to be formed in different regions in a direction perpendicular to a substrate.

According to an aspect of the present disclosure, a memory device may include: a peripheral circuit region including a plurality of circuit elements disposed on a first substrate; and a cell region including at least one channel region extending from an upper surface of a second substrate disposed on the first substrate in a direction perpendicular to the upper surface of the second substrate, and a plurality of gate electrode layers and a plurality of insulating layers stacked on the second substrate to be adjacent to the at least one channel region, wherein at least a portion of the first substrate contacts the second substrate, and the first substrate and the second substrate are configured to provide a single substrate.

The first substrate may include: a first region on which the plurality of circuit elements are disposed; and a second region extending from an upper surface of the first region in a direction perpendicular thereto to contact a lower surface of the second substrate.

A cross-sectional width of the upper surface of the second substrate may be less than or equal to 30 times a cross-sectional width of the second region parallel to the upper surface of the second substrate.

The memory device may further include a peripheral region insulating layer disposed on the first region to fill a space between the first substrate and the second substrate.

The peripheral region insulating layer may include a high density plasma (HDP) oxide film.

An upper surface of the peripheral region insulating layer may be substantially parallel to the upper surface of the second substrate.

An upper surface of the peripheral region insulating layer may be substantially coplanar to the upper surface of the second substrate.

The second region may include a plurality of second regions.

A cross-sectional area of the upper surface of the second substrate may be smaller than a cross-sectional area of the first region substantially parallel to the upper surface of the second substrate.

At least one of the plurality of circuit elements may be electrically connected to at least one of the plurality of gate electrode layers.

The first substrate and the second substrate may be configured to provide a single substrate including single crystal silicon.

According to another aspect of the present disclosure, a memory device may include: a first substrate; a second substrate disposed on the first substrate; a plurality of transistors disposed on the second substrate and forming memory cells; and a plurality of circuit elements disposed on the first substrate, wherein the first substrate and the second substrate are configured to provide a single substrate including single crystal silicon.

The first substrate may include: a first region on which the plurality of circuit elements are disposed; and a second region extending from an upper surface of the first region in a direction perpendicular thereto to contact a lower surface of the second substrate.

A cross-sectional width of the second substrate may be less than or equal to 30 times a cross-sectional width of the second region.

The memory device may further include a peripheral region insulating layer disposed between the first substrate and the second substrate to cover the plurality of circuit elements.

BRIEF DESCRIPTION OF DRAWINGS

The above and other aspects, features and advantages of the present disclosure will be more clearly understood from the following detailed description taken in conjunction with the accompanying drawings, in which:

FIGS. 8A through 8M are cross-sectional views illustrating a method of manufacturing a memory device according to an exemplary embodiment of the present disclosure;

FIGS. 9A through 9K are cross-sectional views illustrating a method of manufacturing a memory device according to an exemplary embodiment of the present disclosure;

DETAILED DESCRIPTION

Figure 1:
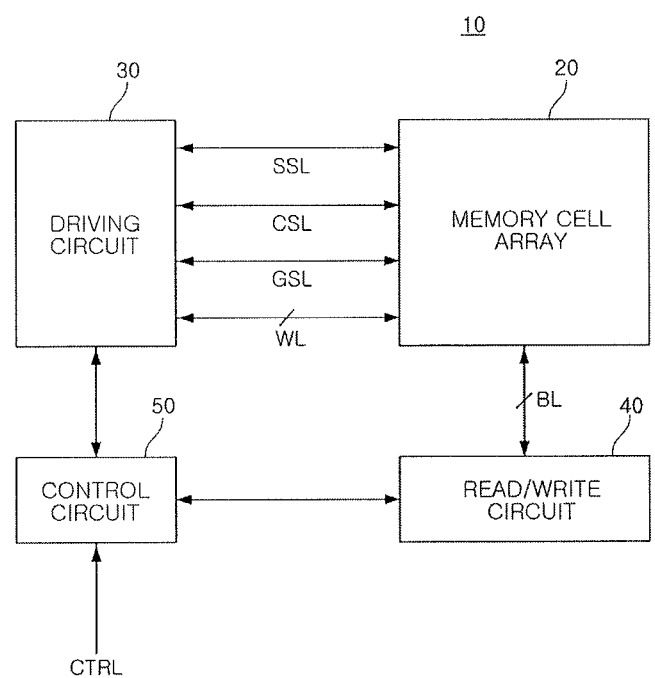
FIG. 1 is a block diagram schematically illustrating a memory device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a block diagram schematically illustrating a memory device according to an exemplary embodiment of the present disclosure.

Referring to FIG. 1, a memory device 10 according to an exemplary embodiment of the present disclosure may include a memory cell array 20, a driving circuit 30, a read/write circuit 40, and a control circuit 50.

The memory cell array 20 may include a plurality of memory cells, and the plurality of memory cells may be arranged in a plurality of columns and rows. The plurality of memory cells included in the memory cell array 20 may be connected to the driving circuit 30 through at least one word line WL, at least one common source line CSL, at least one string select line SSL, at least one ground select line GSL, or the like, and may be connected to the read/write circuit 40 through at least one bit line BL. In the exemplary embodiment, a plurality of memory cells arranged in the same row may be connected to the same word line WL, and a plurality of memory cells arranged in the same column may be connected to the same bit line BL.

The plurality of memory cells included in the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In the exemplary embodiment, the driving circuit 30 may receive address information from the control circuit 50, decode the received address information, and select at least a portion of the word lines WL, the common source lines CSL, the string source lines SSL and the ground select lines GSL connected to the memory cell array 20. The driving circuit 30 may include a driving circuit with respect to each of the word lines WL, the string select lines SSL, and the common source lines CSL.

The read/write circuit 40 may select at least one of the bit lines BL connected to the memory cell array 20 according to a command received from the control circuit 50. The read/write circuit 40 may read data stored in a memory cell connected to the selected bit line BL or write data to the memory cell connected to the selected bit line BL. In order to perform the foregoing operation, the read/write circuit 40 may include circuits such as a page buffer, an input/output buffer, a data latch, and the like.

The control circuit 50 may control operations of the driving circuit 30 and the read/write circuit 40 in response to a control signal CTRL transmitted from the outside. In case of reading data stored in the memory cell array 20, the control circuit 50 may control the operation of the driving circuit 30 to supply a voltage for a read operation to a word line storing data desired to be read. When the voltage for a read operation is supplied to a particular word line WL, the control circuit 50 may control the read/write circuit 40 to read data stored in a memory cell connected to the word line WL to which the voltage for a read operation has been supplied.

Meanwhile, in case of writing data to the memory cell array 20, the control circuit 50 may control the operation of the driving circuit 30 to supply a voltage for a write operation to a word line in which data is desired to be written. When the voltage for a write operation is supplied to a particular word line WL, the control circuit 50 may control the read/write circuit 40 to write data to a memory cell connected to the word line WL to which the voltage for a write operation has been applied.

Figure 2:
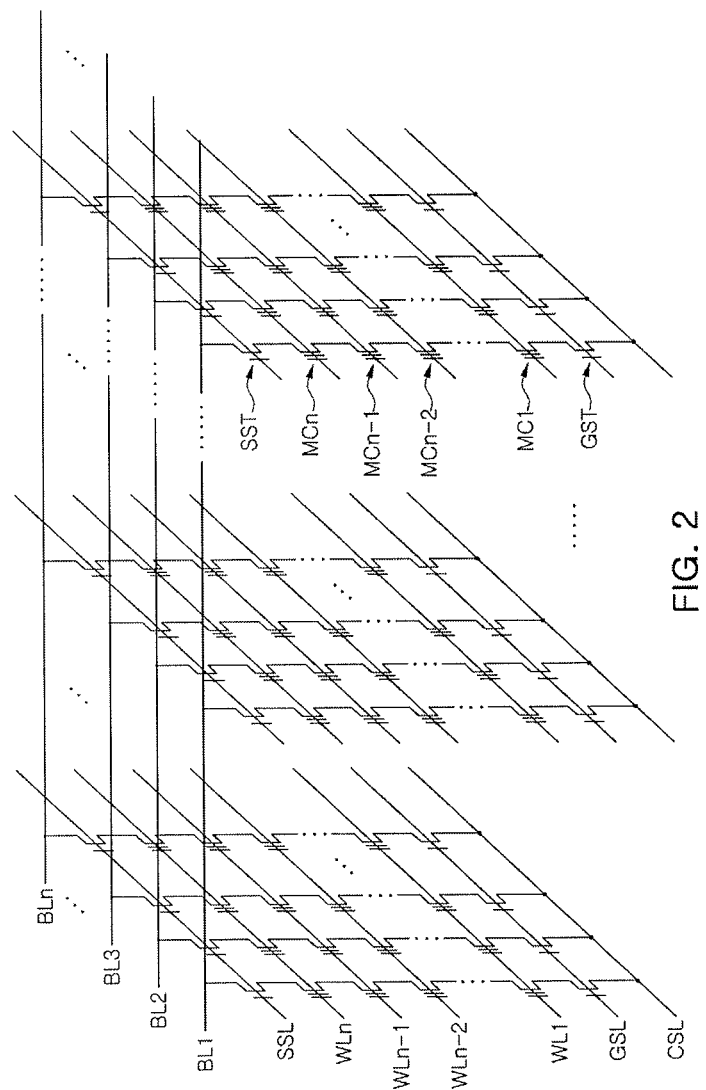
FIG. 2 is an equivalent circuit diagram illustrating a memory cell array of a memory device according to an exemplary embodiment of the present disclosure.

FIG. 2 is an equivalent circuit diagram illustrating a memory cell array of a memory device according to an exemplary embodiment of the present disclosure.

Referring to FIG. 2, the memory cell array according to the exemplary embodiment may include a plurality of memory cell strings, each of which may include n number of memory cells MC1 to MCn connected in series, and a ground select transistor GST and a string select transistor SST connected in series to ends of the outermost memory cells MC1 and MCn.

The n number of series-connected memory cells MC1 to MCn may be connected to the word lines WL1 to WLn, respectively, for selecting at least a portion of the memory cells MC1 to MCn.

A gate terminal of the ground select transistor GST may be connected to the ground select line GSL, and a source terminal thereof may be connected to the common source line CSL. Meanwhile, a gate terminal of the string select transistor SST may be connected to the string select line SSL, and a source terminal thereof may be connected to a drain terminal of the memory cell MCn. FIG. 2 illustrates a structure in which a single ground select transistor GST and a single string select transistor SST are connected to the n number of series-connected memory cells MC1 to MCn; however, a plurality of ground select transistors GST and a plurality of string select transistors SST may be connected thereto.

A drain terminal of the string select transistor SST may be connected to one of bit lines BL1 to BLn. When a signal is applied to the gate terminal of the string select transistor SST through the string select line SSL, the signal applied through the selected bit line may be transmitted to the n number of series-connected memory cells MC1 to MCn to execute a data read or write operation. In addition, by applying a signal to the gate terminal of the ground select transistor GST having the source terminal connected to the common source line CSL through the gate select line GSL, an erase operation for removing all of electric charges stored in the n number of memory cells MC1 to MCn may be executed.

Figure 3:
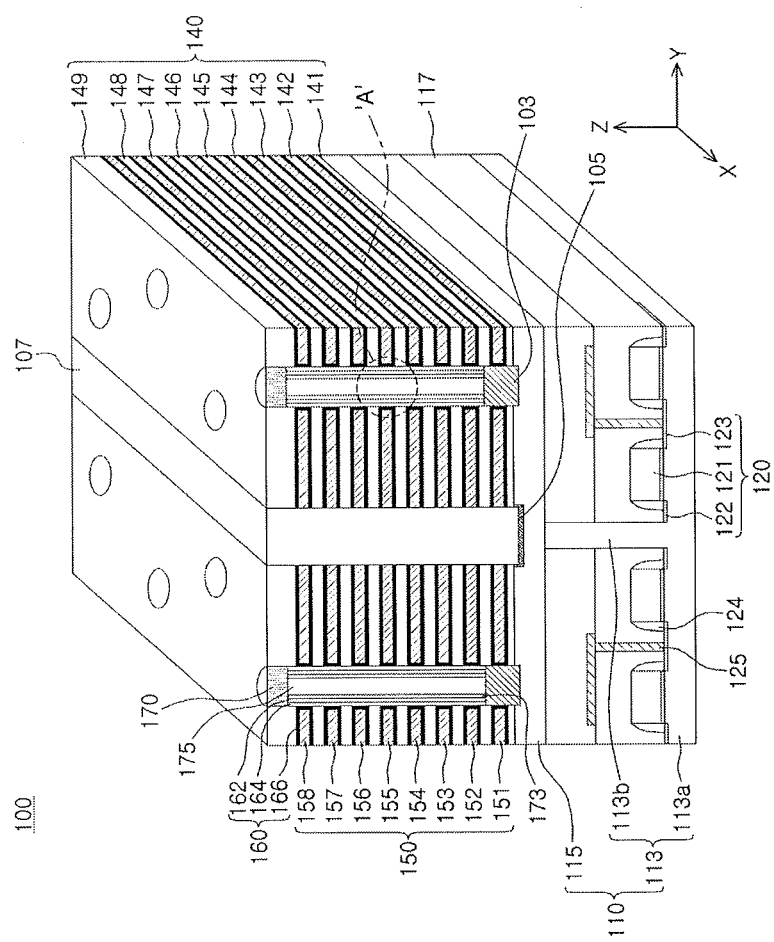
FIGS. 3 and 4 are a perspective view and a cross-sectional view illustrating a memory device according to an exemplary embodiment of the present disclosure, respectively.
Figure 4:
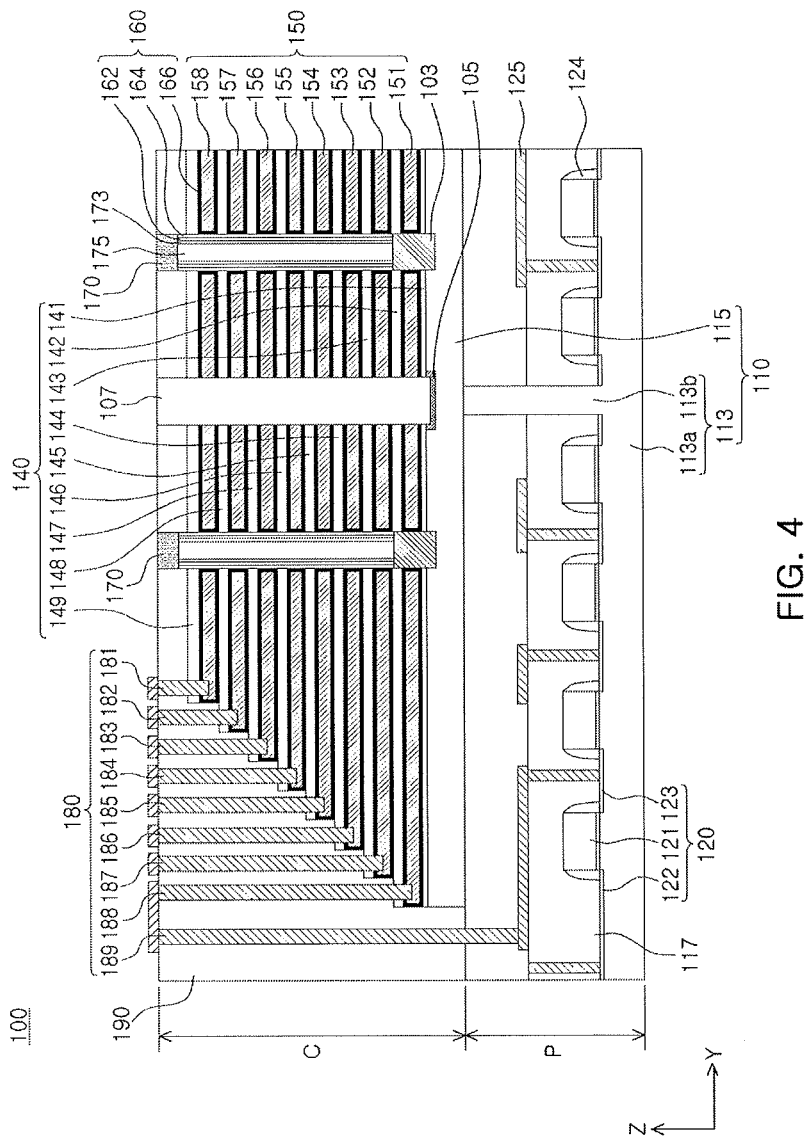

FIGS. 3 and 4 are a perspective view and a cross-sectional view illustrating a memory device according to an exemplary embodiment of the present disclosure, respectively.

FIG. 3 is a perspective view illustrating a portion of a memory device 100 according to an exemplary embodiment of the present disclosure. Referring to FIG. 3, the memory device 100 may include: a substrate 110; at least one channel region 173 disposed in a direction perpendicular to an upper surface of the substrate 110; and a plurality of insulating layers 140 and a plurality of gate electrode layers 150 stacked around an outer wall of the channel region 173. In addition, the memory device 100 may include a gate dielectric layer 160 disposed between the plurality of gate electrode layers 150 and the channel region 173, and a buried insulating layer 175 may be disposed inside the channel region 173.

The upper surface of the substrate 110 may extend in an x-axis direction and a y-axis direction as illustrated in FIG. 3.

The substrate 110 may include a semiconductor material, such as group IV semiconductor, group III-V compound semiconductor, or group II-VI oxide semiconductor. For example, in a case in which the substrate 110 includes group IV semiconductor, the substrate 110 may be a silicon substrate. In addition, the substrate 110 may be provided as a bulk wafer or an epitaxial layer.

The substrate 110 may include a first substrate 113 and a second substrate 115. The first substrate 113 is disposed below the second substrate 115, and at least a portion of the first substrate 113 may contact the second substrate 115. Referring to FIG. 3, the first substrate 113 may include a first region 113a and a second region 113b, and a plurality of circuit elements 120 may be disposed on an upper surface of the first region 113a. The plurality of circuit elements 120 disposed on the upper surface of the first region 113a may constitute a peripheral circuit region. Accordingly, in the exemplary embodiment illustrated in FIG. 3, the peripheral circuit region in the memory device 100 may be disposed below a cell region.

Metal lines 125 in addition to the plurality of circuit elements 120 may be further formed on the first substrate 113 and may be electrically connected to the plurality of circuit elements 120. The plurality of circuit elements 120 may each include a horizontal transistor. In this case, each circuit element 120 may include a gate electrode 121, a source electrode 122 and a drain electrode 123, and a gate spacer 124 may be provided on both lateral surfaces of the gate electrode 121.

The second region 113b may be extended from the upper surface of the first region 113a in a direction perpendicular thereto and may contact a lower surface of the second substrate 115. In a process of manufacturing the memory device 100, at least a portion of the first substrate 113 may be removed through an etching process or the like to form the first and second regions 113a and 113b, and then the plurality of circuit elements 120 and a peripheral region insulating layer 117 may be formed on the first region 113a. Thereafter, the second substrate 115 may be disposed on the peripheral region insulating layer 117, thereby forming the substrate 110 as illustrated in FIG. 3. The peripheral region insulating layer 117 may include a high density plasma (HDP) oxide film in order to efficiently fill a space between the plurality of circuit elements 120.

As illustrated in FIG. 3, in a case in which the peripheral circuit region including the plurality of circuit elements 120 is formed below the cell region, the first substrate 113 for forming the plurality of circuit elements 120 and the second substrate 115 for forming the cell region are necessary. In a case in which the second substrate 115 is prepared after the plurality of circuit elements 120 are formed on the first substrate 113 and then are covered with the peripheral region insulating layer 117, the second substrate 115 is generally prepared by depositing or growing polysilicon. In this case, however, the characteristics of a transistor including a gate electrode layer 151 disposed in the lowermost portion of the cell region may deteriorate, or variations in heights of epitaxial layers 103 disposed below the channel regions 173 may occur.

In the exemplary embodiment of the present disclosure, an amorphous silicon substrate may be disposed on the peripheral region insulating layer 117 while contacting the second region 113b formed by removing the portion of the first substrate 113, and single crystallization of the amorphous silicon substrate may propagate from the second region 113b to thereby form the second substrate 115 including single crystal silicon. That is, in the exemplary embodiment of the present disclosure, the first substrate 113 and the second substrate 115 may be configured to provide a single substrate 110 including single crystal silicon, e.g., the first substrate 113 and the second substrate 115 may define a same and single substrate 110. Thus, deterioration in characteristics of the gate electrode layer 150 included in the cell region, the variations in the heights of the epitaxial layers 103, and the like may be prevented. A method of manufacturing the substrate 110 will be detailed with reference to FIGS. 8A through 8M below.

Meanwhile, a cross-sectional width of the second substrate 115 may be less than or equal to 30 times a cross-sectional width of the second region 113b. In the exemplary embodiment of FIG. 3, the width of the second substrate 115 in the x-axis direction or in the y-axis direction may be less than or equal to 30 times the width of the second region 113b in the x-axis direction or in the y-axis direction. Since the single crystallization of the second substrate 115 including amorphous silicon propagates from the second region 113b of the first substrate 113 provided as the single crystal silicon substrate, the single crystallization of the second substrate 115 may not efficiently propagate if an area of the second substrate 115 is excessively larger than an area of the second region 113b. For example, in a case in which the width of the second region 113b in the x-axis direction or in the y-axis direction may be 100 nm, the width of the second substrate 115 in the x-axis direction or in the y-axis direction may be 2 μm to 3 μm.

The channel region 173 may be disposed on an upper surface of the second substrate 115 while extending in a direction perpendicular thereto (a z-axis direction). The channel region 173 may be formed to have the form of an annular structure surrounding the buried insulating layer 175 therein. According to exemplary embodiments, the channel region 173 may have a cylindrical or prismatic shape without the buried insulating layer 175. In addition, the channel region 173 may have an inclined lateral surface narrowed toward the substrate 110 according to an aspect ratio thereof.

The channel regions 173 may be spaced apart from each other in the x-axis and y-axis directions. However, the arrangement of the channel regions 173 may be varied according to exemplary embodiments. For example, the channel regions 173 may be disposed in a zigzag form at least in one direction. In addition, adjacent channel regions 173 with a separation insulating layer 107 interposed therebetween may be symmetrical to each other as illustrated, but the arrangement thereof is not limited thereto.

A lower surface of the channel region 173 may directly contact the second substrate 115 to be electrically connected thereto. The channel region 173 may include a semiconductor material such as polysilicon or single crystal silicon. The semiconductor material may be an undoped material or may include p-type or n-type impurities.

A plurality of gate electrode layers 151 to 158 (150) may be disposed to be spaced apart from the second substrate 115 in the z-axis direction around the lateral surface of the channel region 173. Referring to FIG. 3 together with FIG. 2, the plurality of gate electrode layers 150 may each provide the gate terminal of the ground select transistor GST, the gate terminals of the plurality of memory cells MC1 to MCn, and the gate terminal of the string select transistor SST. The gate electrode layers 152 to 157 may be extended to provide the word liens WL1 to WLn, and may be connected in common to a set of adjacent memory cell strings arranged in the x-axis and y-axis directions. In the exemplary embodiment, the gate electrode layers 152 to 157 providing the memory cells MC1 to MCn are illustrated as six layers, but it is merely exemplary. The number of gate electrode layers 152 to 157 providing the memory cells MC1 to MCn may be determined according to the capacity of the memory device 100. For example, the number of gate electrode layers 152 to 157 providing the memory cells MC1 to MCn may be 2n (where n is a natural number).

The gate electrode layer 151 of the ground select transistor GST may provide the ground select line GSL. The gate electrode layer 158 of the string select transistor SST may provide the string select line SSL. In particular, the gate electrode layer 158 of the string select transistor SST may be divided to form different string select lines SSL between adjacent memory cell strings. According to exemplary embodiments, the gate electrode layer 158 of the string select transistor SST and the gate electrode layer 151 of the ground select transistor GST may each include two or more electrode layers and may have different structures from those of the gate electrode layers 152 to 157 of the memory cells MC1 to MCn.

The plurality of gate electrode layers 150 may include a polysilicon or metal silicide material. For example, the metal silicide material may be a silicide material including a metal selected from among cobalt (Co), nickel (Ni), hafnium (Hf), platinum (Pt), tungsten (W) and titanium (Ti). According to exemplary embodiments, the plurality of gate electrode layers 150 may include a metal material, for example, tungsten (W). In addition, although not shown, the plurality of gate electrode layers 150 may further include a diffusion barrier. For example, the diffusion barrier may include at least one of tungsten nitride (WN), tantalum nitride (TaN), and titanium nitride (TiN).

A plurality of insulating layers 141 to 149 (140) may be disposed between the plurality of gate electrode layers 150. The plurality of insulating layers 140 may be spaced apart from each other in the z-axis direction while extending in the y-axis direction, like the arrangement of the plurality of gate electrode layers 150. However, an eighth insulating layer 148 and a ninth insulating layer 149 may be connected to each other in the gate electrode layer 158 of the string select transistor SST. The plurality of insulating layers 140 may include an insulating material such as a silicon oxide or a silicon nitride.

Figure 7A:
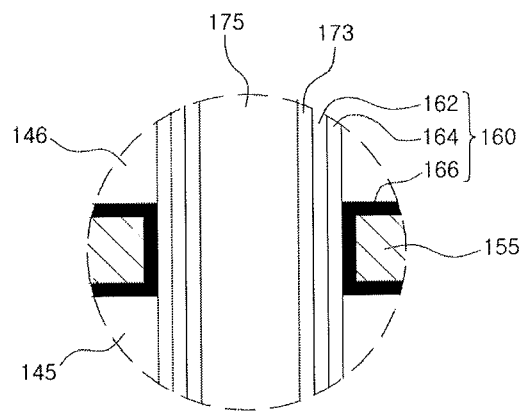
FIGS. 7A and 7B are cross-sectional views illustrating gate dielectric layers and channel regions in memory devices according to exemplary embodiments of the present disclosure.

The gate dielectric layer 160 may be disposed between the plurality of gate electrode layers 150 and the channel region 173. The gate dielectric layer 160 may include a tunneling layer 162, a charge storage layer 164, and a blocking layer 166, and details thereof will be provided below with reference to FIG. 7A illustrating an enlarged view of region A of FIG. 3.

The tunneling layer 162 may allow charges to tunnel to the charge storage layer 164 using the Fowler-Nordheim (F-N) tunneling mechanism. For example, the tunneling layer 162 may include a silicon oxide. The charge storage layer 164 may be a charge trapping layer or a floating gate conductive layer. For example, the charge storage layer 164 may include a dielectric material, quantum dots or nanocrystals. Here, the quantum dots or the nanocrystals may be formed of conductors, such as metals or semiconductor fine particles. The blocking layer 166 may include a high-k dielectric material. Here, the high-k dielectric material refers to a dielectric material having a higher dielectric constant than that of a silicon oxide.

A drain region 170 may be disposed at the top of the memory cell string to cover an upper surface of the buried insulating layer 175 and to be electrically connected to the channel region 173. For example, the drain region 170 may include doped polysilicon. The drain region 170 may serve as the drain terminal of the string select transistor SST (see FIG. 2).

Meanwhile, a source region 105 for each of the ground select transistors GST arranged in the x-axis direction (see FIG. 2) may be disposed at the bottom of the memory cell string. The source region 105 may be disposed to be adjacent to the upper surface of the second substrate 115 while extending in the x-axis direction, and may be divided into unit regions spaced apart from each other in the y-axis direction. For example, a single source region 105 may be provided for every two channel regions 173 in the y-axis direction, but the arrangement thereof is not limited thereto. The separation insulating layer 107 may be formed on the source region 105.

In a case in which the source region 105 has a conductivity opposite to that of the second substrate 115, the source region 105 may serve as the source terminals of the adjacent ground select transistors GST, and may be connected to the common source line CSL as illustrated in FIG. 2.

Hereinafter, the gate dielectric layer 160 included in the memory device 100 of FIG. 3 will be described with reference to FIG. 7A. FIG. 7A is a partially enlarged view of region A of FIG. 3.

FIG. 7A illustrates a gate electrode layer 155, insulating layers 145 and 146, the gate dielectric layer 160 and the channel region 173 included in region A of FIG. 3. The buried insulating layer 175 may be disposed inside the channel region 173. The gate dielectric layer 160 may have a structure in which the tunneling layer 162, the charge storage layer 164, and the blocking layer 166 are sequentially stacked on the channel region 173. Relative thicknesses of the above layers forming the gate dielectric layer 160 are not limited to those illustrated in FIG. 7A, and may be varied.

The tunneling layer 162 may include at least one of a silicon oxide ($SiO_2$), a silicon nitride ($Si_3N4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$).

The charge storage layer 164 may be a charge trapping layer or a floating gate conductive film. In a case in which the charge storage layer 164 is a floating gate conductive film, the charge storage layer 164 may be formed by depositing polysilicon through low pressure chemical vapor deposition (LPCVD), for example. In a case in which the charge storage layer 164 is a charge trapping layer, it may include at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), and an aluminum gallium nitride ($AlGa_xN_y$).

The blocking layer 166 may include a silicon oxide ($SiO_2$), a silicon nitride ($Si_3N_4$), a silicon oxynitride (SiON), or a high-k dielectric material. The high-k dielectric material may be any one of an aluminum oxide ($Al_2O_3$), a tantalum oxide ($Ta_2O_3$), a titanium oxide ($TiO_2$), an yttrium oxide ($Y_2O_3$), a zirconium oxide ($ZrO_2$), a zirconium silicon oxide ($ZrSi_xOy$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The blocking layer 166 is illustrated as including a single layer in FIG. 7A, but it may include a plurality of layers having different dielectric constants. In a case in which the blocking layer 166 includes a high-k dielectric layer and a low-k dielectric layer, the low-k dielectric layer may be disposed to contact the charge storage layer 164. The high-k dielectric layer may be formed of a material having a higher dielectric constant than that of the tunneling layer 162, and the low-k dielectric layer may be formed of a material having a relatively low dielectric constant to that of the high-k dielectric layer. By disposing the low-k dielectric layer on the side of the high-k dielectric layer, an energy band having a height as high as that of a barrier may be adjusted to improve the characteristics (e.g., erase characteristics) of the memory device.

FIG. 4 is a cross-sectional view of the memory device 100 of FIG. 3 viewed in the x-axis direction. In the cross-sectional view of FIG. 4, it is illustrated that the plurality of gate electrode layers 150 and the plurality of insulating layers 140 extend to have different lengths in the y-axis direction to thereby form a pad region, and a plurality of contact plugs 181 to 189 (180) are electrically connected to the plurality of gate electrode layers 150 in the pad region and to at least one of the plurality of circuit elements 120.

Referring to FIG. 4, in the memory device 100 according to the exemplary embodiment of the present disclosure, the substrate 110 may include the first substrate 113 and the second substrate 115. The first substrate 113 may be disposed below the second substrate 115, and the first substrate 113 may have the first region 113a and the second region 113b. The plurality of circuit elements 120 and the metal lines 125 electrically connected to the plurality of circuit elements 120 may be disposed on the first region 113a, and the plurality of circuit elements 120 and the metal lines 125 may be covered with the peripheral region insulating layer 117.

The second substrate 115 may be disposed on the peripheral region insulating layer 117, and at least a portion of the second substrate 115 may contact the second region 113b of the first substrate 113. By disposing a substrate including amorphous silicon on the second region 113b of the first substrate 113 including single crystal silicon and heating the amorphous silicon substrate in a solid phase epitaxy (SPE) process or the like to allow for single crystallization, the second substrate 115 including single crystal silicon may be formed. That is, both the first substrate 113 and the second substrate 115 may include single crystal silicon.

The channel region 173 may be disposed above the second substrate 115 in the direction perpendicular to the upper surface of the second substrate 115. In addition, the plurality of gate electrode layers 150 and the plurality of insulating layers 140 may be stacked on the second substrate 115 so as to be adjacent to the channel region 173. As described above with reference to FIG. 3, the gate dielectric layer 160 may be disposed between the plurality of gate electrode layers 150 and the channel region 173, and the gate dielectric layer 160 may include the tunneling layer 162, the charge storage layer 164, and the blocking layer 166 sequentially stacked on the channel region 173.

That is, by forming the plurality of circuit elements 120 and the metal lines 125 on the first substrate 113, and forming the plurality of gate electrode layers 150 and the channel regions 173 on the second substrate 115 disposed on the first substrate 113, the peripheral circuit region P may be disposed below the cell region C. Therefore, the peripheral circuit region P may be reduced in the x-axis and y-axis directions, whereby the degree of integration of the memory device 100 may be enhanced and the size of a chip may be reduced.

The plurality of gate electrode layers 150 and the plurality of insulating layers 140 may extend to have different lengths in the y-axis direction to provide the pad region, and the plurality of contact plugs 180 may be electrically connected to the plurality of gate electrode layers 150 in the pad region and to at least one of the plurality of circuit elements 120. Here, the contact plug 189 connected to at least one of the plurality of circuit elements 120 may be electrically connected to the contact plug 188 connected to the lowermost gate electrode layer 151 provided as the gate terminal of the ground select transistor GST. Meanwhile, it is illustrated in FIG. 4 that a single metal line 125 among the plurality of metal lines is connected to the contact plug 189; however, the metal lines 125 may be connected to the other contact plugs in different positions in the x-axis direction.

Figure 5:
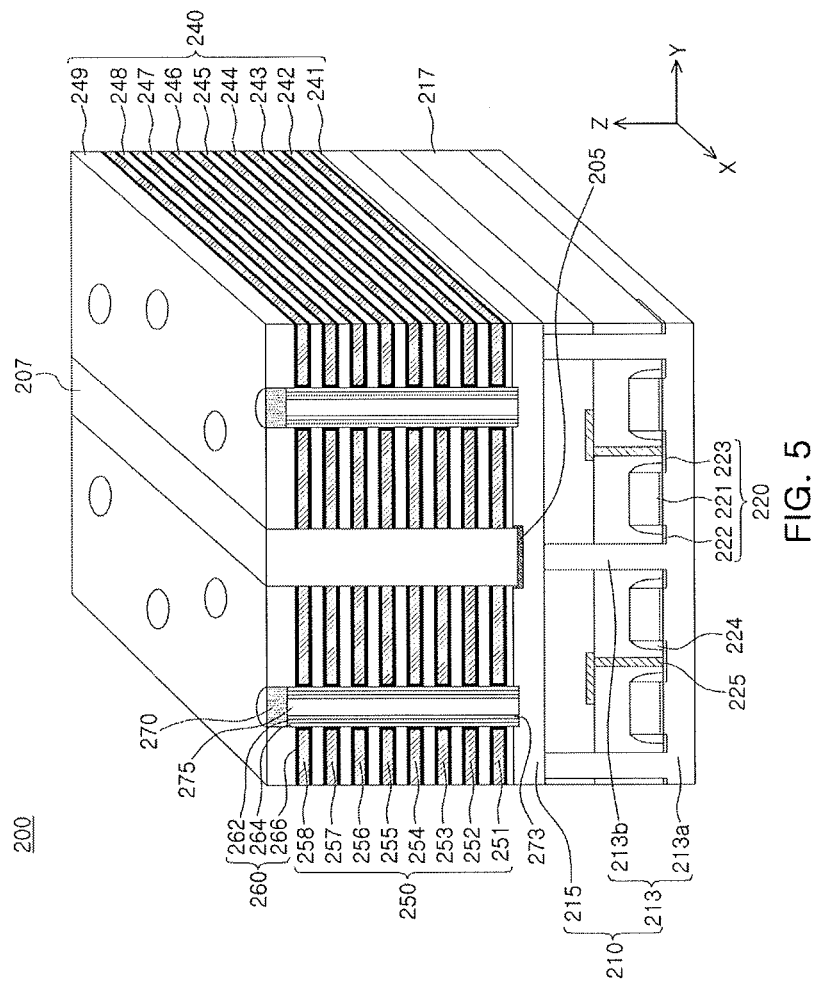
FIGS. 5 and 6 are perspective views illustrating memory devices according to exemplary embodiments of the present disclosure.
Figure 6:
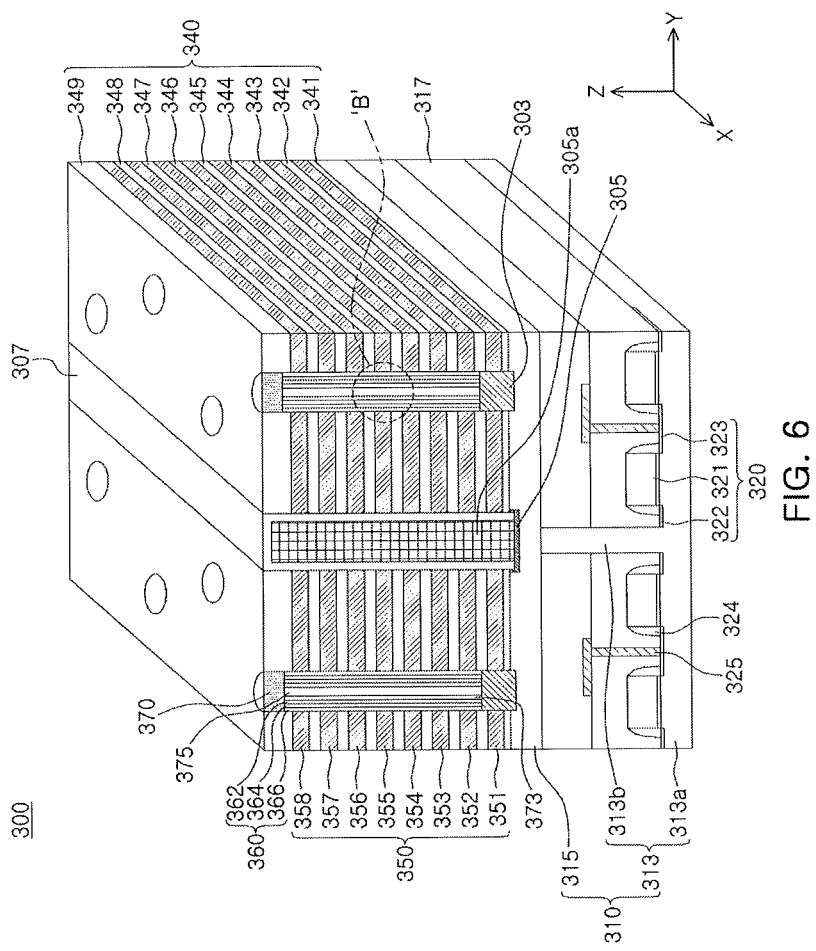

FIGS. 5 and 6 are perspective views illustrating memory devices according to exemplary embodiments of the present disclosure.

Referring to FIG. 5, a memory device 200 may include a substrate 210 having a first substrate 213 and a second substrate 215, a channel region 273, a plurality of gate electrode layers 251 to 258 (250), a plurality of insulating layers 241 to 249 (240), a source region 205, a buried insulating layer 207 and a gate dielectric layer 260, similar to the memory device 100 of FIG. 4. In the exemplary embodiment illustrated in FIG. 5, however, the first substrate 213 may include a plurality of second regions 213b. By forming the plurality of second regions 213b to be extended from an upper surface of a first region 213a in a direction perpendicular thereto so as to contact a lower surface of the second substrate 215, single crystallization of the second substrate 215 may efficiently propagate in a manufacturing process. In addition, the memory device 200 illustrated in FIG. 5 may have no epitaxial layer between the second substrate 215 and the channel region 273, such that the channel region 273 directly contacts the second substrate 215.

Meanwhile, a plurality of circuit elements 210, a gate spacer 224 and metal lines 225 may be disposed on the upper surface of the first region 213a. At least one of the metal lines 225 may be electrically connected to the lowermost gate electrode layer 251 provided as a gate terminal of a ground select transistor through a contact plug in a pad region in which the plurality of gate electrode layers 250 and the plurality of insulating layers 240 extend to have different lengths in the y-axis direction.

FIG. 6 is a perspective view illustrating a memory device 300 according to an exemplary embodiment of the present disclosure different from the embodiments of FIGS. 3 through 5. Referring to FIG. 6, the memory device 300 according to the present exemplary embodiment may include: a substrate 310 having a first substrate 313 and a second substrate 315; a plurality of circuit elements 320 disposed on a first region 313a of the first substrate 313; and a channel region 373 and a plurality of gate electrode layers 351 to 358 (350) disposed on an upper surface of the second substrate 315. A plurality of insulating layers 341 to 349 (340) may be disposed between the plurality of gate electrode layers 350, and a source region 305 may be disposed on the upper surface of the second substrate 315.

Unlike the memory devices 100 and 200 illustrated in FIGS. 3 through 5, the memory device 300 illustrated in FIG. 6 may further include a common source line 305a connected to the source region 305. The bottom of the common source line 305a may be connected to the source region 305, and the common source line 305a may be electrically insulated from the plurality of gate electrode layers 350 through a separation insulating layer 307 disposed around the common source line 305a. The common source line 305a may extend in the z-axis direction on the source region 305, and may be arranged to ohmic-contact the source region 105. The common source line 305a may extend in the x-axis direction on the source region 305, and may include a conductive material. For example, the common source line 305a may include tungsten (W), aluminum (Al) or copper (Cu).

At least a portion of the second substrate 315 may contact a second region 313b of the first substrate 313. The second region 313b may be extended from an upper surface of a first region 313a of the first substrate 313 in a direction perpendicular thereto. By disposing an amorphous silicon substrate on a peripheral region insulating layer 317 to contact the second region 313b and allowing the amorphous silicon to be single-crystallized from the second region 313b, the second substrate 315 including single crystal silicon may be formed.

Meanwhile, in the memory device 300 illustrated in FIG. 6, a gate dielectric layer 360 may be disposed between the channel region 373 and the plurality of gate electrode layers 350. The gate dielectric layer 360 may include a tunneling layer 362, a charge storage layer 364, and a blocking layer 366, and the blocking layer 366 may be formed to extend in parallel to the channel region 373, unlike the memory devices 100 and 200 illustrated in FIGS. 3 through 5. Hereinafter, the gate dielectric layer 360 will be detailed with reference to FIG. 7B.

Figure 7B:
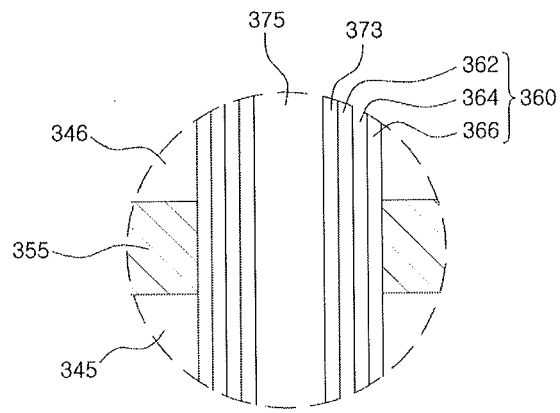

FIG. 7B is a partially enlarged view of region B of FIG. 6.

FIG. 7B illustrates a gate electrode layer 354, insulating layers 344 and 345, the gate dielectric layer 360 and the channel region 373 included in region B of FIG. 6. A buried insulating layer 375 may be disposed inside the channel region 373. The gate dielectric layer 360 may have a structure in which the tunneling layer 362, the charge storage layer 364 and the blocking layer 366 are sequentially stacked on the channel region 173. Relative thicknesses of the above layers forming the gate dielectric layer 360 are not limited to those illustrated in FIG. 7B, and may be varied.

The blocking layer 166 is illustrated as surrounding the gate electrode layer 155 in FIG. 7A, while the blocking layer 366 is illustrated as extending in parallel to the channel region 373 in FIG. 7B. That is, in FIG. 7B, the channel region 373 may be surrounded by the tunneling layer 362, the charge storage layer 364, and the blocking layer 366. Meanwhile, materials included in the tunneling layer 362, the charge storage layer 364, and the blocking layer 366 may be similar to those in the exemplary embodiment described with reference to FIG. 7A.

Hereinafter, a method of manufacturing the memory device illustrated in FIGS. 3 and 4 will be described with reference to FIGS. 8A through 8M.

FIGS. 8A through 8M are views illustrating a method of manufacturing the memory device 100 illustrated in FIGS. 3 and 4. FIGS. 8A through 8M are cross-sectional views of FIG. 3 viewed in the x-axis direction according to a processing order.

Referring to FIG. 8A, the first substrate 113 may be provided. The first substrate 113 may include single crystal silicon. Next, referring to FIG. 8B, at least a portion of the first substrate 113 may be removed to form the first region 113a and the second region 113b extending from the upper surface of the first region 113a in the direction perpendicular thereto. In order to form the first and second regions 113a and 113b, an etching process may be applied to the first substrate 113.

Next, referring to FIG. 8C, the plurality of circuit elements 120 and the metal lines 125 connected to the plurality of circuit elements 120 may be formed on the first region 113a. For example, the plurality of circuit elements 120 may include horizontal transistors. In case of including the horizontal transistors, the plurality of circuit elements 120 may each include the horizontal source electrode 122, the horizontal drain electrode 123 and the horizontal gate electrode 121 formed by injecting impurities into the first substrate 113. The gate electrode 121 may be formed of polysilicon, metal, or a stack of polysilicon and metal silicide. A horizontal gate insulating film may be further provided between the gate electrode 121 and the second substrate 115, and the gate spacer 124 may be provided on the lateral surfaces of the gate electrode 121. The gate spacer 124 may be formed by depositing a silicon oxide film or the like on the horizontal gate electrode 121 using a medium temperature oxide (MTO) process, and applying an etch-back process thereto.

The plurality of circuit elements 120 and the metal lines 125 may be covered with the peripheral region insulating layer 117. In order to effectively fill a space between the plurality of circuit elements 120, the peripheral region insulating layer 117 may include an HDP oxide layer having excellent gap filling properties. After the peripheral region insulating layer 117 is formed, a portion of the peripheral region insulating layer 117 may be removed to allow the upper surface of the peripheral region insulating layer 117 and the upper surface of the second region 113b to be coplanar as illustrated in FIG. 8D. At this time, the upper surface of the peripheral region insulating layer 117 may be substantially parallel to the upper surface of the first region 113a. Meanwhile, the thickness of the peripheral region insulating layer 117 may be limited to 1.8 μm or less in consideration of an SPE process to be subsequently applied thereto.

Figure 8E:
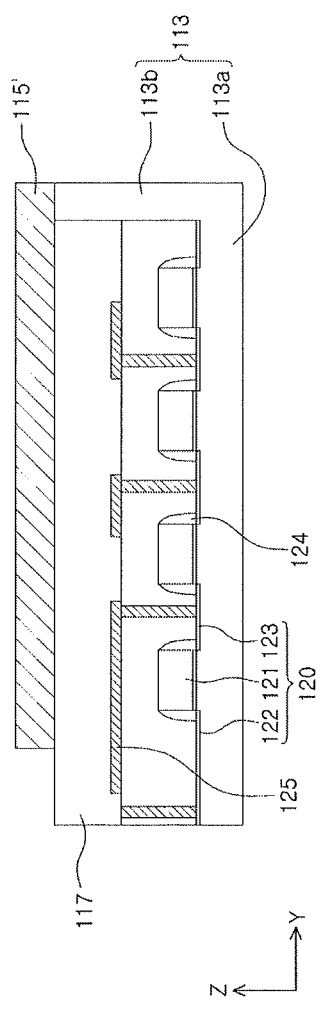

Then, referring to FIG. 8E, an amorphous silicon substrate 115' may be formed on the peripheral region insulating layer 117 and the second region 113b. The amorphous silicon substrate 115' may be formed by depositing SiH4 or Si2H6, and at least a portion of the amorphous silicon substrate 115' may contact the upper surface of the second region 113b.

Figure 8F:
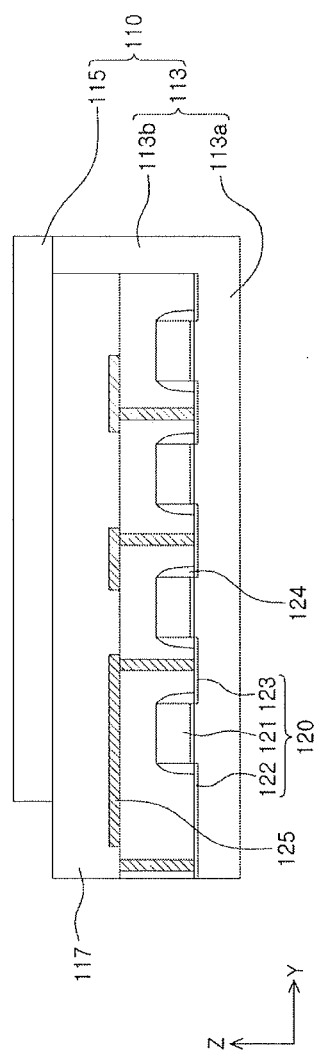

After the amorphous silicon substrate 115' is formed, an SPE process, a laser epitaxial growth (LEG) process or the like may be performed on the amorphous silicon substrate 115' to allow for the single crystallization of the amorphous silicon substrate 115' as illustrated in FIG. 8F. The single crystallization of the amorphous silicon substrate 115' may propagate from a portion of the amorphous silicon substrate 115' in contact with the second region 113b in a lateral direction (the y-axis direction of FIG. 8E). By single-crystallizing the amorphous silicon substrate 115', the second substrate 115 including single crystal silicon may be formed. In order to form the second substrate 115 by single-crystallizing the amorphous silicon substrate 115' in the lateral direction, the cross-sectional width of the second substrate 115 may be less than or equal to 30 times the cross-sectional width of the second region 113b.

The amorphous silicon substrate 115' may be single-crystallized through a heat treatment process such as a rapid thermal annealing (RTA) process and a flash RTA process, or a laser melting process using an excimer laser or the like. In case of using an LEG process for the single crystallization, both laser shot and laser scan methods may be used. In a case in which the amorphous silicon substrate 115' is single-crystallized using the SPE process, an inert gas source such as nitrogen, argon, helium, or the like may be used at 500° C. to 700° C.

Figure 8G:
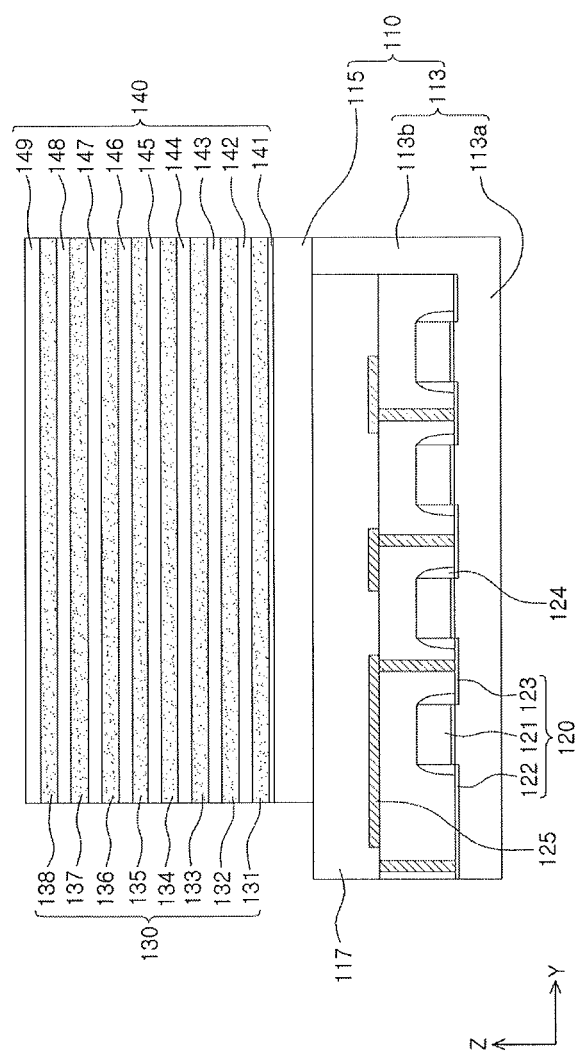

Referring to FIG. 8G, the plurality of insulating layers 141 to 149 (140) and a plurality of sacrificial layers 131 to 138 (130) may be alternately stacked on the single-crystallized second substrate 115. The plurality of sacrificial layers 130 may be formed of a material that may be selectively etched as they have high etch selectivity with respect to the plurality of insulating layers 140. Etch selectivity may be expressed quantitatively by a ratio of an etch rate of the sacrificial layers 130 to an etch rate of the insulating layers 140. For example, the insulating layers 140 may be at least one of a silicon oxide film and a silicon nitride film, and the sacrificial layers 130 may be formed of a material different from that of the insulating layers 140, selected from among a silicon film, a silicon oxide film, a silicon carbide film, and a silicon nitride film. For example, in a case in which the insulating layers 140 are formed of silicon oxide films, the sacrificial layers 130 may be formed of silicon nitride films.

According to exemplary embodiments of the present disclosure, the plurality of insulating layers 140 may have different thicknesses. For example, the insulating layer 141 positioned in the lowermost portion, among the plurality of insulating layers 140 in the z-axis direction, may be relatively thin as compared to the other insulating layers 142 to 149, and the insulating layer 149 positioned in the uppermost portion may be relatively thick as compared to the other insulating layers 141 to 148. Namely, the thicknesses of the insulating layers 140 and the sacrificial layers 130 may be varied without being limited to those illustrated in FIG. 8G, and the number of layers of the films constituting the insulating layers 140 and the sacrificial layers 130 may also be varied.

Figure 8H:
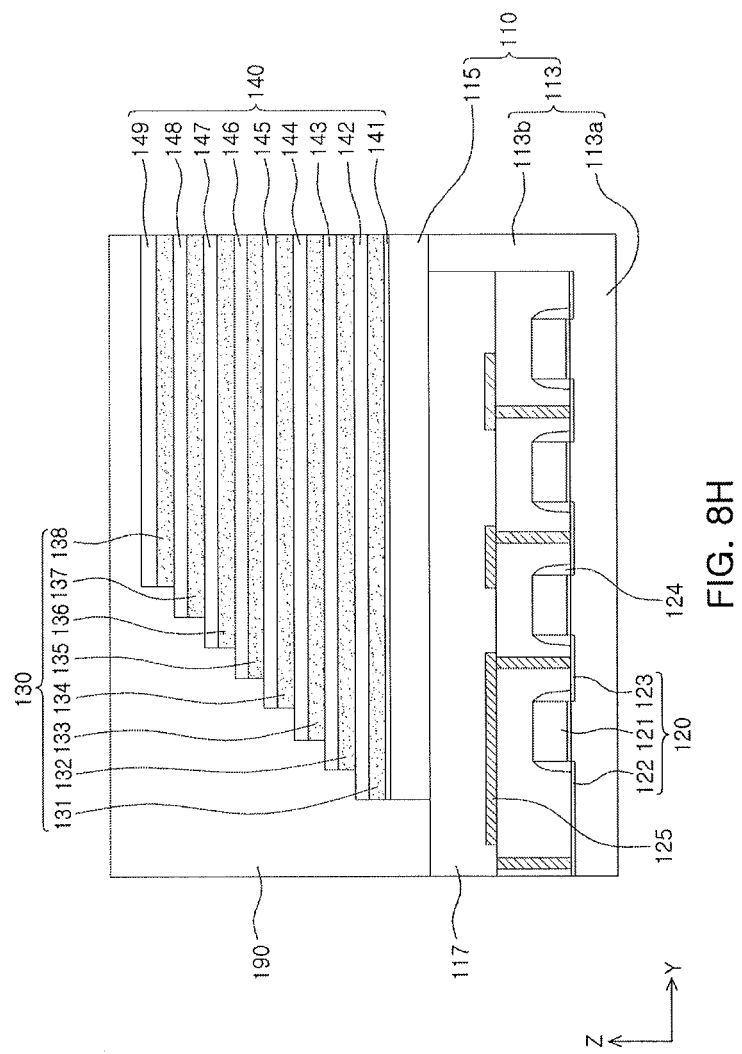

Then, referring to FIG. 8H, the plurality of sacrificial layers 130 and the plurality of insulating layers 140 alternately stacked on the second substrate 115 may be etched to form the pad region having a step structure. In order to form the step structure between the sacrificial layers 130 and the insulating layers 140 adjacent in the z-axis direction as illustrated in FIG. 8H, predetermined mask layers may be formed on the plurality of sacrificial layers 130 and the plurality of insulating layers 140 alternately stacked on the second substrate 115, and portions of the sacrificial layers 130 and the insulating layers 140 exposed through the mask layers may be etched. By repeatedly etching the portions of the sacrificial layers 130 and the insulating layers 140 exposed through the mask layers in a plurality of times while trimming the mask layers, the sacrificial layers 130 and the insulating layers 140 may be sequentially etched to form a plurality of steps as illustrated in FIG. 8H.

In the exemplary embodiment, the insulating layers 140 and the sacrificial layers 130 may be paired, and the insulating layers 140 and the sacrificial layers 130 included in the plurality of pairs may extend to have substantially the same length in one direction, for example, in the y-axis direction. As an exception, an insulating layer 141 may be further disposed below the sacrificial layer 131 positioned in the lowermost portion in the z-axis direction such that it extends to have substantially the same length. After the step structure is formed, an interlayer insulating layer 190 may be formed on the pad region obtained by etching the portions of the insulating layers 140 and the sacrificial layers 130.

Figure 8I:
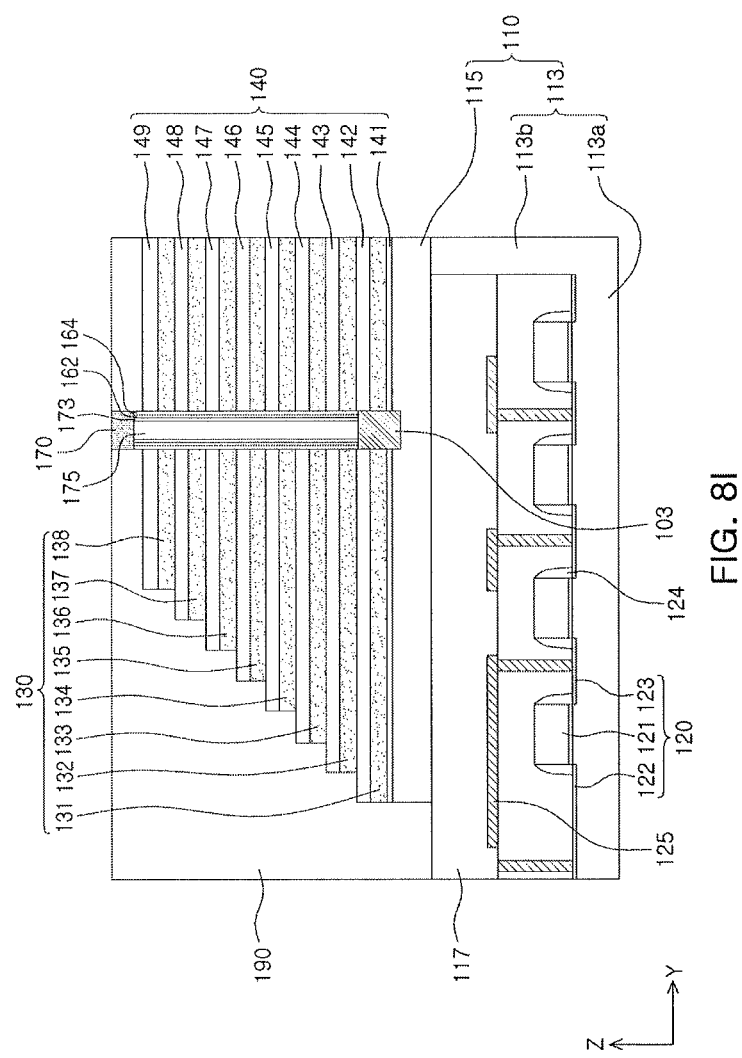

After the interlayer insulating layer 190 is formed, the channel region 173 may be formed as illustrated in FIG. 8I. In order to form the channel region 173, an opening may be formed to penetrate through the plurality of insulating layers 140 and the plurality of sacrificial layers 130 in the z-axis direction. A plurality of openings may be provided according to the number of channel regions 173, and the plurality of openings may be disposed in a zigzag form to be spaced apart from each other on the x-y plane perpendicular to the z-axis. The plurality of openings may be formed by exposing only the portions of a mask layer corresponding to the plurality of openings to be formed, and anisotropic-etching the exposed portions, similar to the method of forming the step structure. Each of the plurality of openings may expose the upper surface of the second substrate 115 or have a predetermined depth in the second substrate 115.

The charge storage layer 164 and the tunneling layer 162 may be formed on inner and lower surfaces of each of the plurality of openings by using atomic layer deposition (ALD) or chemical vapor deposition (CVD). Here, the charge storage layer 164 and the tunneling layer 162 may be sequentially stacked on regions adjacent to the plurality of sacrificial layers 130 and the plurality of insulating layers 140, and the channel region 173 may be formed inside the tunneling layer 162. The channel region 173 may be formed to have a predetermined thickness. For example, the channel region 173 may have a thickness ranging from 1/50 to 1/5 of a width of each of the plurality of openings, and may be formed through ALD or CVD in a manner similar to that of the charge storage layer 164 and the tunneling layer 162. Meanwhile, prior to the forming of the charge storage layer 164 and the tunneling layer 162, the epitaxial layers 103 may be formed by performing a selective epitaxial growth (SEG) process using regions of the second substrate 115 exposed through the plurality of openings as seeds.

The interior of the channel region 130 may be filled with the buried insulating layer 175. Optionally, prior to forming the buried insulating layer 175, hydrogen annealing may be performed to heat-treat the structure of the channel region 173 under a gas atmosphere including hydrogen or heavy hydrogen. A large portion of crystal defects existing in the channel region 173 may be reduced and/or eliminated by the hydrogen annealing process.

The structure of the channel region 173 is based on FIGS. 3 and 4, but the channel region 173 may also be formed to have different structures. For example, after the plurality of openings for the channel regions are formed, each channel region 173 may be formed immediately without performing the process of forming the charge storage layer 164, the tunneling layer 162 and the epitaxial layer 103, and the buried insulating layer 175 may be formed within the channel region 173. In this case, like the blocking layer 166, the tunneling layer 162 and the charge storage layer 164 may be formed before a process of forming the gate electrode layers 150 so as to be disposed outside the blocking layer 166 while surrounding the gate electrode layer 150. In addition, there is no epitaxial layer 103, and thus the channel region 173 may directly contact the second substrate 115.

Next, a planarization process may be performed to remove an unnecessary semiconductor material and an insulating material covering the interlayer insulating layer 190 in the uppermost portion. Thereafter, an upper portion of the buried insulating layer 175 may be removed by using an etching process, or the like, and a material for forming a conductive layer 170 may be deposited in a position corresponding to the upper portion of the buried insulating layer 175 which has been removed. A planarization process may be performed again to form the conductive layer 170.

Figure 8J:
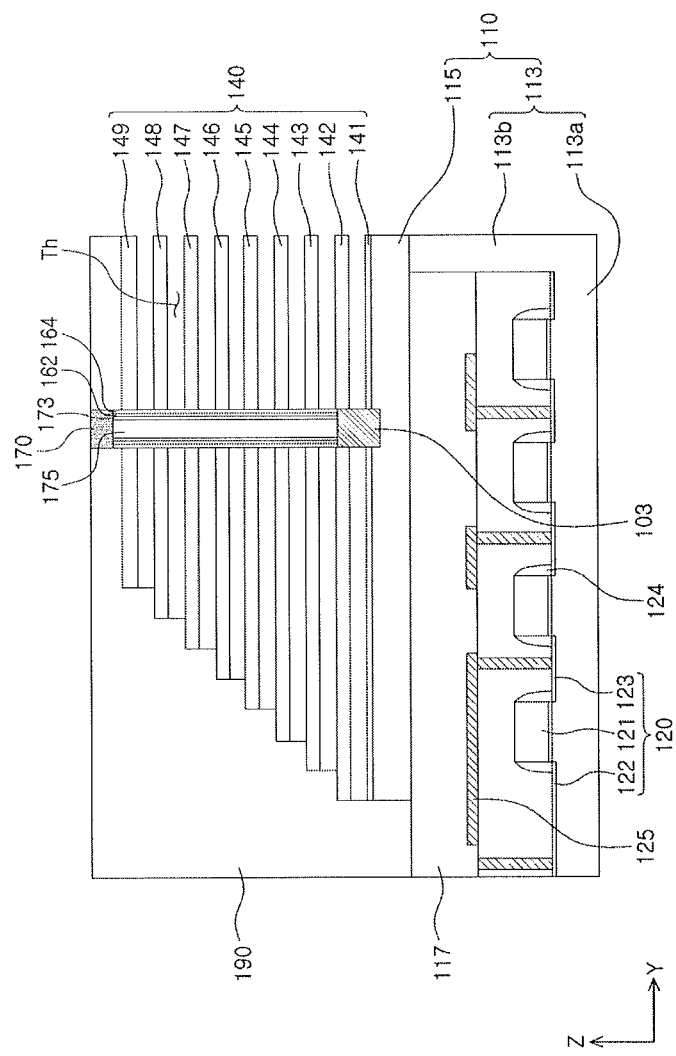

After the channel region 173 is formed, the plurality of sacrificial layers 130 may be removed to form lateral openings Th as illustrated in FIG. 8J. Here, as the plurality of sacrificial layers 130 are removed, the plurality of lateral openings Th may be formed between the plurality of insulating layers 140. A conductive material may be deposited on the interior of the plurality of lateral openings Th to form the gate electrode layers 150.

Figure 8K:
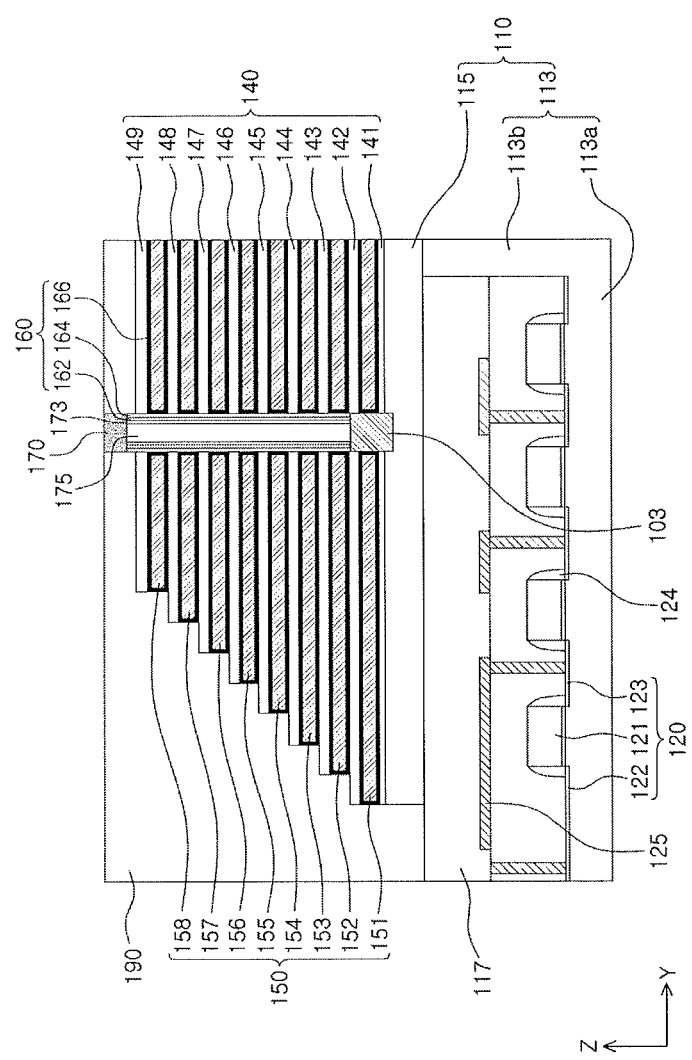

Referring to FIG. 8K, the blocking layers 166 and the gate electrode layers 151 to 158 (150) may be formed within the lateral openings Th. In forming the blocking layers 166 and the gate electrode layers 150 sequentially within the lateral openings Th, the blocking layers 166 may be formed through ALD, CVD, or physical vapor deposition (PVD), similar to the charge storage layer 164 and the tunneling layer 166. Prior to forming the gate electrode layers 150, the blocking layers 166 may be formed to surround the gate electrode layers 150 as illustrated in FIG. 8K. The gate electrode layers 150 may be formed of a conductive material such as tungsten (W).

Figure 8L:
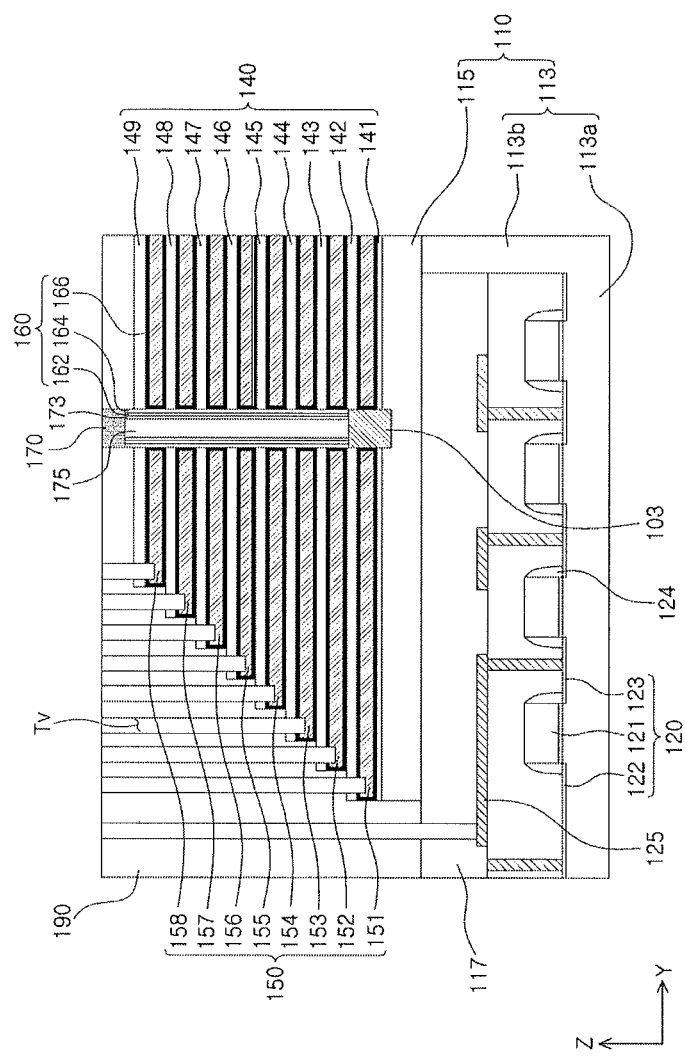

After the blocking layers 166 and the gate electrode layers 150 are formed, an etching process may be performed in the z-axis direction parallel to the channel region 173 to form a plurality of vertical openings Tv for forming the contact plugs 180, as illustrated in FIG. 8L. The etching process for forming the plurality of vertical openings Tv may include a process of forming a mask layer having open regions corresponding to the vertical openings Tv and a process of selectively etching the interlayer insulating layer 190, the peripheral region insulating layer 117 and the plurality of insulating layers 140 with respect to the plurality of gate electrode layers 150. By selectively etching only materials included in the interlayer insulating layer 190, the peripheral region insulating layer 117 and the plurality of insulating layers 140 with respect to a material included in the plurality of gate electrode layers 150, the vertical openings Tv may be extended to the gate electrode layers 150 and the metal line 125, as illustrated in FIG. 8L. According to exemplary embodiments, the vertical opening Tv may have a tapered structure having an inclined lateral surface so as to have a width narrowed toward the substrate 110 due to a high aspect ratio.

Figure 8M:
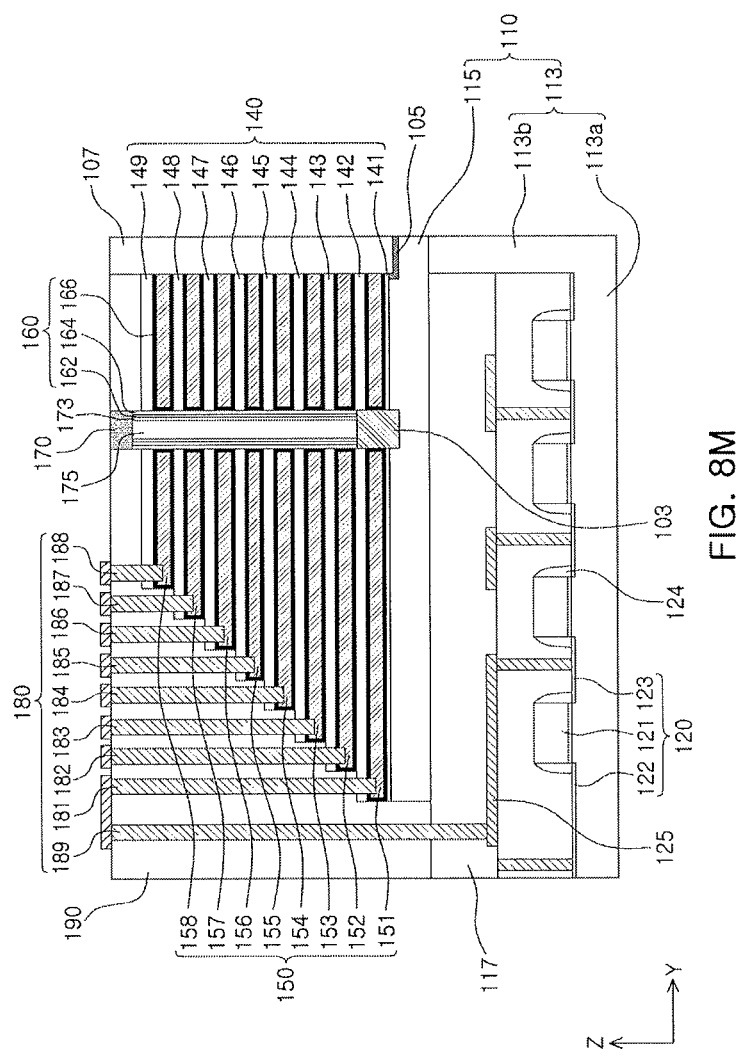

After the mask layer for forming the plurality of vertical openings Tv is removed, the plurality of vertical openings Tv may be filled with a conductive material as illustrated in FIG. 8M, thereby forming the contact plugs 181 to 189 (180). The contact plugs 180 may include a conductive material, for example, tungsten (W), similar to the gate electrode layers 150. The contact plugs 181 to 188 connected to the gate electrode layers 150 may penetrate through the insulating layers 140 disposed on the gate electrode layers 150 in the step structure so as to be electrically connected to the gate electrode layers 150. In order to make electrical connections with the gate electrode layers 150, the vertical openings Tv for forming the respective contact plugs 181 to 188 may be extended to have depths allowing for the vertical openings Tv to penetrate through the blocking layers 162 surrounding the gate electrode layers 150. Meanwhile, the contact plug 189 electrically connected to the metal line 125 connected to at least one of the plurality of circuit elements 120 may have a length extending from an upper surface of the interlayer insulating layer 190 to the metal line 125. That is, the length of the contact plug 189 electrically connected to the metal line 125 may be greater than the sum of the thicknesses of the gate electrode layers 150 providing the memory cells and the thicknesses of the insulating layers 140.

Hereinafter, a method of manufacturing the memory device illustrated in FIG. 6 will be described with reference to FIGS. 9A through 9K.

FIGS. 9A through 9K are views illustrating a method of manufacturing the memory device 300 illustrated in FIG. 6. FIGS. 9A through 9K are cross-sectional views of FIG. 6 viewed in the x-axis direction according to a processing order.

Figures 9A, 9B:
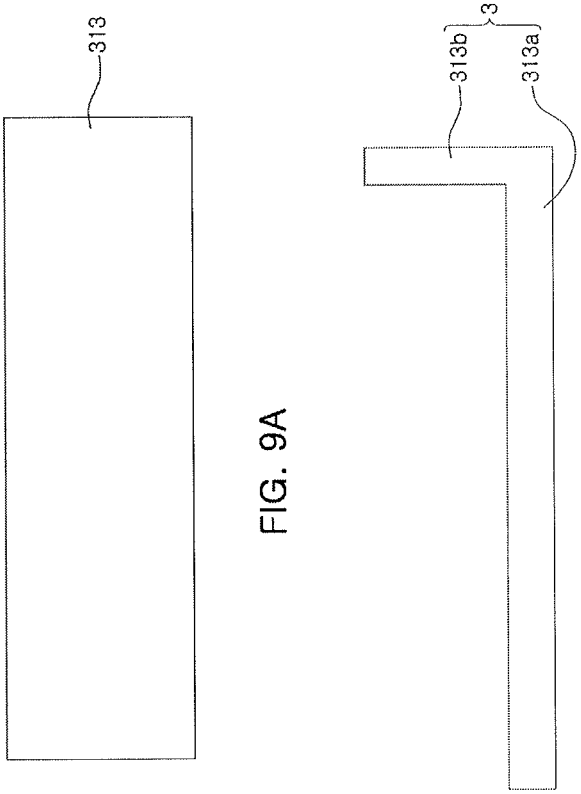

Referring to FIG. 9A, the first substrate 313 including single crystal silicon may be provided. Next, referring to FIG. 9B, at least a portion of the first substrate 313 may be removed to form the first region 313a and the second region 313b. As illustrated in FIG. 9B, the upper surface of the first region 313a may be parallel to the x-axis and y-axis directions, and the second region 313b may extend from the upper surface of the first region 313a in the direction perpendicular thereto.

Next, referring to FIG. 9C, the plurality of circuit elements 320 may be formed on the first region 313a. For example, the plurality of circuit elements 320 may include horizontal transistors, each of which includes a gate electrode 321, a source electrode 322, and a drain electrode 323. A gate spacer 324 may be formed on both lateral surfaces of the gate electrode 321.

The peripheral region insulating layer 317 may be formed on the first region 313a to cover the plurality of circuit elements 320. The peripheral region insulating layer 317 may include an HDP oxide layer having excellent gap filling properties, and may have one or more layers. At least a portion of the peripheral region insulating layer 317 may be removed to form metal lines 325. Next, referring to FIG. 9D, a portion of the peripheral region insulating layer 317 may be removed to allow an upper surface of the peripheral region insulating layer 317 and an upper surface of the second region 313b to be co-planar. At this time, at least a portion of the second region 313b along with the portion of the peripheral region insulating layer 317 may be removed.

Referring to FIG. 9E, an amorphous silicon substrate 315' may be provided on the peripheral region insulating layer 317. The amorphous silicon substrate 315' may be formed by depositing SiH4 or Si2H6, and at least a portion of the amorphous silicon substrate 115' may contact the upper surface of the second region 313b.

After the amorphous silicon substrate 315' is formed, an SPE process, an LEG process or the like may be performed on the amorphous silicon substrate 315' to allow for the single crystallization of the amorphous silicon substrate 315' as illustrated in FIG. 9F. The single crystallization of the amorphous silicon substrate 315' may propagate from a portion of the amorphous silicon substrate 315' in contact with the second region 313b in a lateral direction (the y-axis direction of FIG. 9E). The amorphous silicon substrate 315' may be single-crystallized to provide the second substrate 315. The second substrate 315 may contact the second region 313b and the upper surface thereof may be parallel to the upper surface of the first region 313a.

The amorphous silicon substrate 315' may be single-crystallized through a heat treatment process such as an RTA process and a flash RTA process, or a laser melting process using an excimer laser or the like. As described above, in case of using an LEG process for the single crystallization, both laser shot and laser scan methods may be used. In a case in which the amorphous silicon substrate 315' is single-crystallized using the SPE process, an inert gas source such as nitrogen, argon, helium, or the like may be used at 500° C. to 700° C.

Figure 9G:
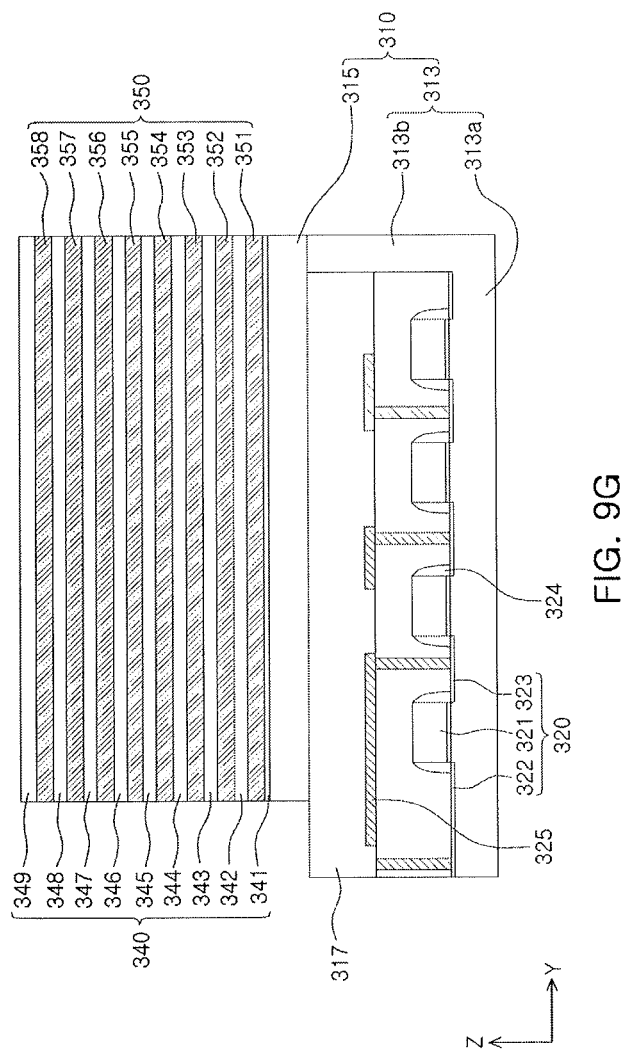

Referring to FIG. 9G, the plurality of gate electrode layers 351 to 358 (350) and the plurality of insulating layers 341 to 349 (340) may be alternately stacked on the single-crystallized second substrate 315. The plurality of gate electrode layers 350 may include a polysilicon or metal silicide material. For example, the metal silicide material may be a silicide material including a metal selected from among cobalt (Co), nickel (Ni), hafnium (Hf), platinum (Pt), tungsten (W) and titanium (Ti). According to exemplary embodiments, the plurality of gate electrode layers 350 may include a metal material, for example, tungsten (W). Unlike the exemplary embodiment illustrated in FIG. 8G, the plurality of gate electrode layers 350 and the plurality of insulating layers 340 may be immediately stacked on the second substrate 315, and thus the process of removing the plurality of sacrificial layers 130 may be omitted.

Figure 9H:
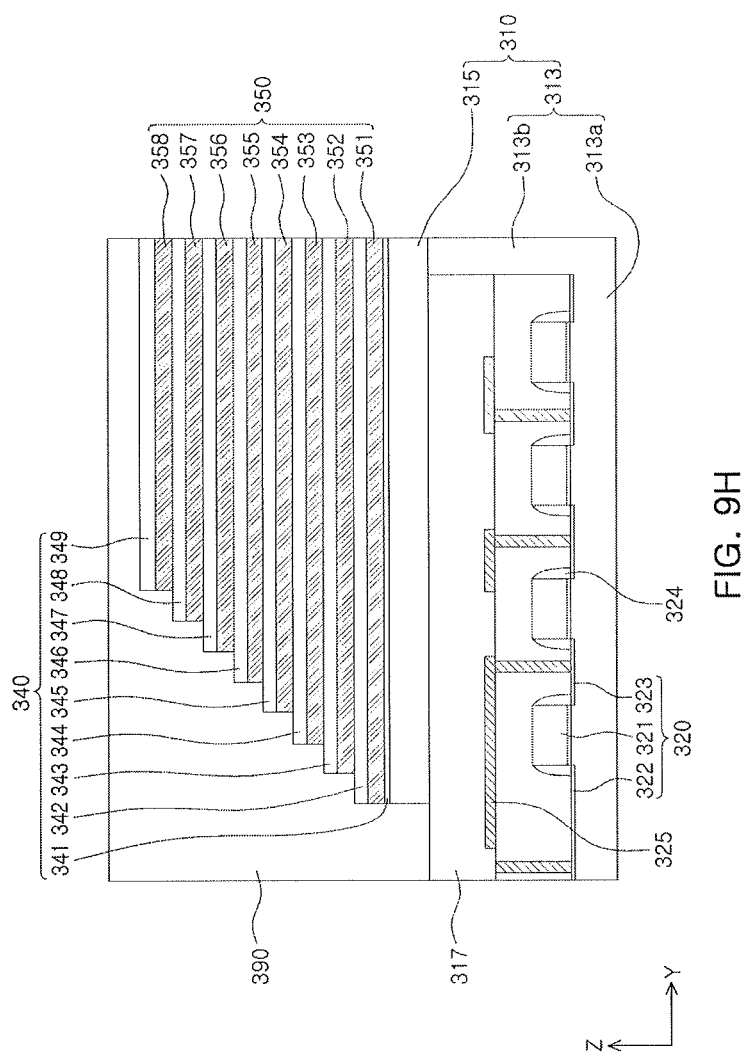

Next, referring to FIG. 9H, the plurality of gate electrode layers 350 and the plurality of insulating layers 340 alternately stacked on the second substrate 115 may be etched to form the pad region having a step structure. The process of forming the pad region may be similar to the corresponding process described above with reference to FIG. 8H. In the exemplary embodiment, the gate electrode layers 350 and the insulating layers 340 may be paired, and the insulating layers 340 and the gate electrode layers 350 included in the plurality of pairs may extend to have substantially the same length in one direction, for example, in the y-axis direction. After the step structure is formed, an interlayer insulating layer 390 may be formed on the pad region.

Figure 9I:
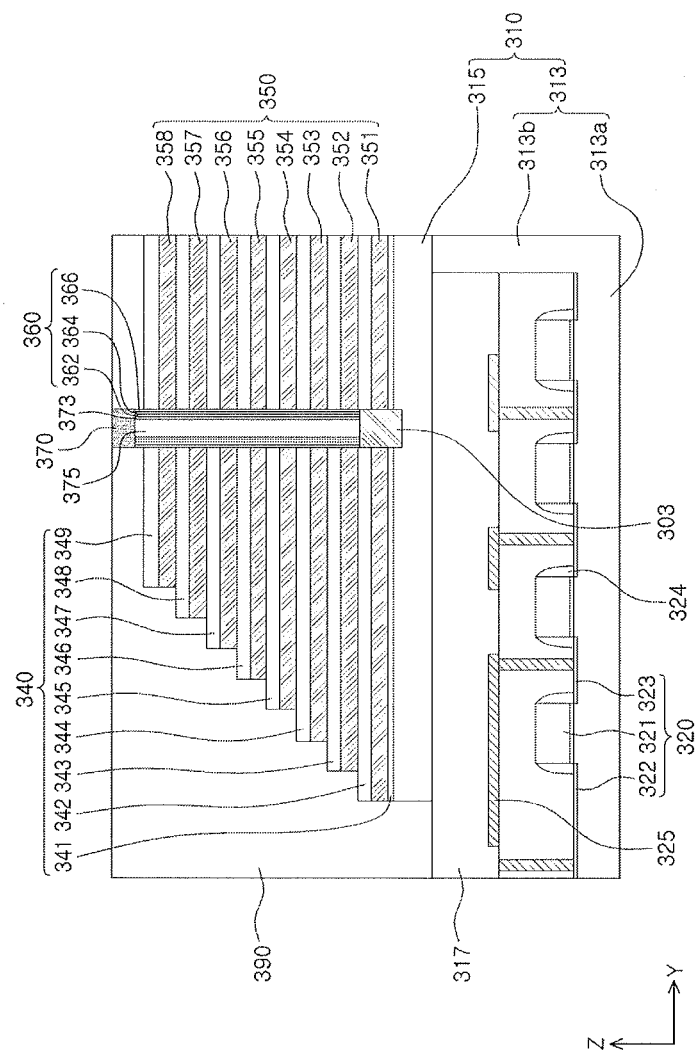

After the interlayer insulating layer 390 is formed, the channel region 373 may be formed as illustrated in FIG. 9I. In order to form the channel region 373, an opening may be formed to penetrate through the plurality of insulating layers 340 and the plurality of gate electrode layers 350 in the z-axis direction. A plurality of openings may be provided according to the number of channel regions 373, and the plurality of openings may be disposed in a zigzag form to be spaced apart from each other on the x-y plane perpendicular to the z-axis. Meanwhile, each of the plurality of openings may expose the upper surface of the second substrate 315 or have a predetermined depth in the second substrate 315.

The gate dielectric layer 360 may be formed on inner and lower surfaces of each of the plurality of openings by using ALD or CVD. The gate dielectric layer 360 may include the tunneling layer 362, the charge storage layer 364, and the blocking layer 366. The blocking layer 366, the charge storage layer 364 and the tunneling layer 362 may be sequentially stacked on regions adjacent to the plurality of insulating layers 340 and the plurality of gate electrode layers 350, and the channel region 373 may be formed inside the tunneling layer 362. The channel region 373 may be formed through ALD or CVD, similar to the gate dielectric layer 360. Meanwhile, prior to forming the gate dielectric layer 360, epitaxial layers 303 may be formed by performing an SEG process using regions of the second substrate 315 exposed through the plurality of openings as seeds.

The interior of the channel region 373 may be filled with the buried insulating layer 375. Optionally, prior to forming the buried insulating layer 175, hydrogen annealing may be performed to heat-treat the structure of the channel region 173 under a gas atmosphere including hydrogen or heavy hydrogen. A large portion of crystal defects existing in the channel region 173 may be reduced and/or eliminated by the hydrogen annealing process.

Next, a planarization process may be performed to remove an unnecessary semiconductor material and an insulating material covering the interlayer insulating layer 390 in the uppermost portion. Thereafter, an upper portion of the buried insulating layer 375 may be removed by using an etching process, or the like, and a material for forming a conductive layer 370 may be deposited in a position corresponding to the upper portion of the buried insulating layer 375 which has been removed. A planarization process may be performed again to form the conductive layer 370.

Figure 9J:
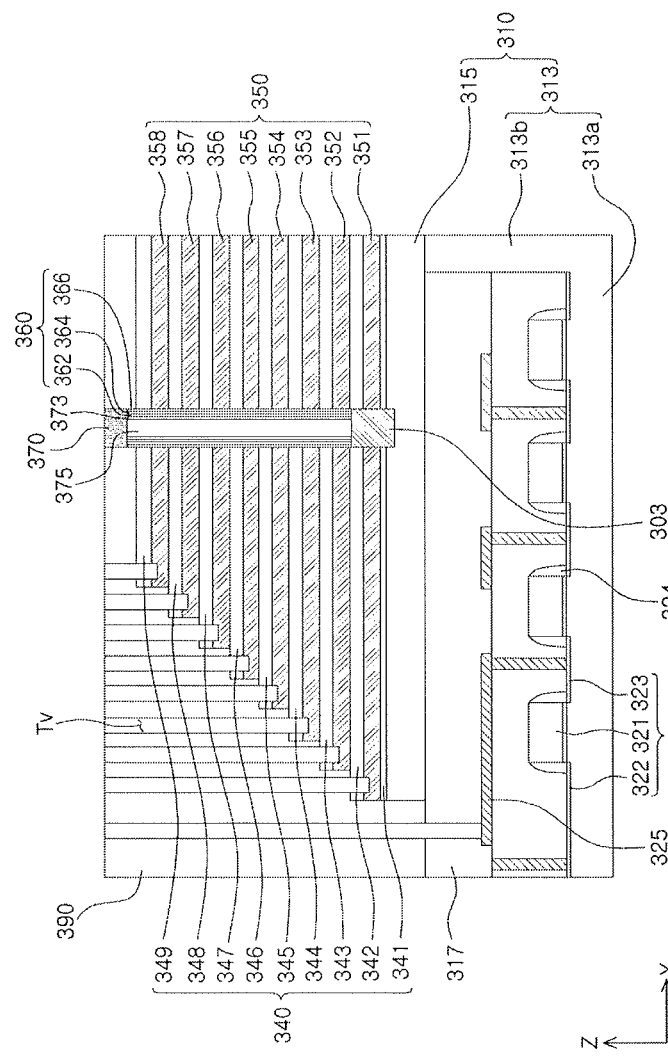

After the channel region 373 is formed, portions of the interlayer insulating layer 390 and the plurality of insulating layers 340 may be etched in the pad region to form vertical openings Tv as illustrated in FIG. 9J. The vertical openings Tv are to form contact plugs, and may be formed by disposing a mask layer having open regions corresponding to the vertical openings Tv and selectively etching portions of the interlayer insulating layer 390, the peripheral region insulating layer 317 and the plurality of insulating layers 340 with respect to the plurality of gate electrode layers 350. Meanwhile, the vertical opening Tv may have a tapered structure having an inclined lateral surface so as to have a width narrowed toward the substrate 310 due to a high aspect ratio.

After the mask layer for forming the plurality of vertical openings Tv is removed, the plurality of vertical openings Tv may be filled with a conductive material as illustrated in FIG. 9K, thereby forming the contact plugs 381 to 389 (380). The contact plugs 380 may include a conductive material, for example, tungsten (W), similar to the gate electrode layers 350. The contact plugs 381 to 388 connected to the gate electrode layers 350 may penetrate through the insulating layers 340 disposed on the gate electrode layers 350 in the step structure so as to be electrically connected to the gate electrode layers 350. In order to make electrical connections with the gate electrode layers 350, the vertical openings Tv for forming the respective contact plugs 381 to 388 may be extended to have predetermined depths in the gate electrode layers 350. Meanwhile, the contact plug 389 electrically connected to the metal line 325 connected to at least one of the plurality of circuit elements 320 may have a length extending from an upper surface of the interlayer insulating layer 390 to the metal line 325. That is, the length of the contact plug 389 electrically connected to the metal line 325 may be greater than the sum of the thicknesses of the gate electrode layers 350 providing the memory cells and the thicknesses of the insulating layers 340.

Figure 10:
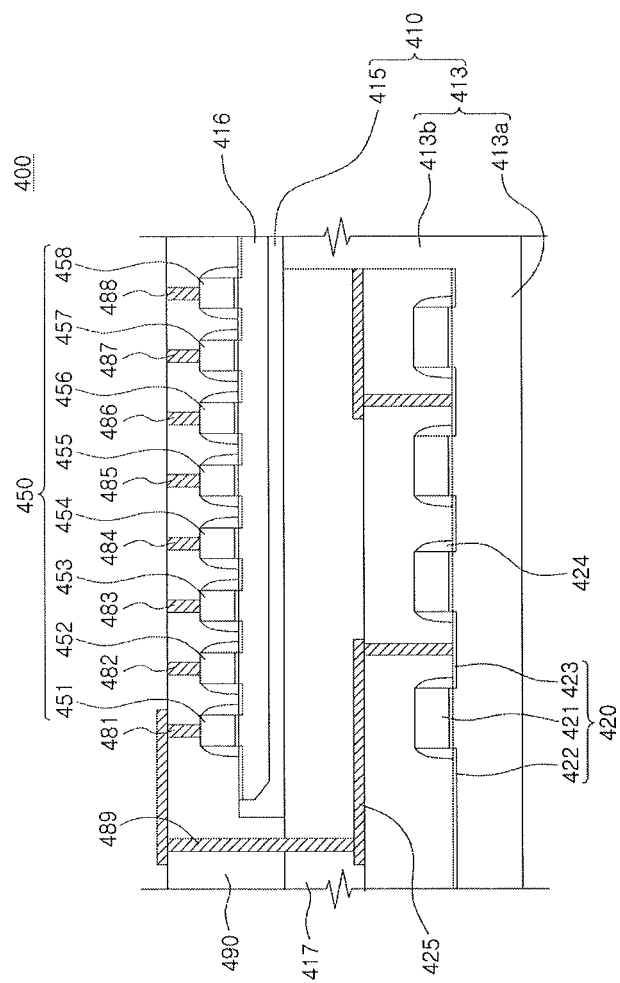
FIG. 10 is a cross-sectional view illustrating the structure of a memory device according to an exemplary embodiment of the present disclosure.

FIG. 10 is a cross-sectional view illustrating the structure of a memory device according to an exemplary embodiment of the present disclosure.

Referring to FIG. 10, a memory device 400 may include a substrate 410, a plurality of circuit elements 420 formed on the substrate 410, and a plurality of gate electrode layers 450 providing memory cells. The substrate 410 may include a first substrate 413 and a second substrate 415 disposed on the first substrate 413. The first substrate 413 may include a first region 413a and a second region 413b extended from an upper surface of the first region 413a in a direction perpendicular thereto. The second region 413b may contact a lower surface of the second substrate 415.

Both the first substrate 413 and the second substrate 415 may include single crystal silicon. The second substrate 415 may be formed by single-crystallizing an amorphous silicon substrate from the second region 413b in contact with the second substrate 415 in a lateral direction. That is, the first and second substrates 413 and 415 may be configured to provide a single substrate 410 including single crystal silicon.

In the present exemplary embodiment, the plurality of gate electrode layers 450 providing the memory cells may be disposed to be parallel to the upper surface of the second substrate 415. The memory device 400 illustrated in the exemplary embodiment of FIG. 10 may include memory cell transistors, each of which is provided by forming a pocket P-well (PPW) electrode 416 in the second substrate 415 and disposing the plurality of gate electrode layers 450 thereabove and source and drain electrodes between the plurality of gate electrode layers 450. Gate electrode layers 451 and 458 positioned at both ends in a direction in which the plurality of gate electrode layers 450 are disposed in parallel may provide a ground select transistor GST and a string select transistor SST.

The plurality of circuit elements 420 may be disposed on the first substrate 413. The plurality of circuit elements 420 may be horizontal transistors, each of which including a gate electrode 421, a source electrode 422 and a drain electrode 423, similar to the memory cell transistors. A gate spacer 424 may be disposed on both lateral surfaces of the gate electrode 421. The plurality of circuit elements 420 may be covered with a peripheral region insulating layer 417. The peripheral region insulating layer 417 may include an HDP oxide film having excellent gap filling properties.

At least one of the plurality of circuit elements 420 may be electrically connected to at least one of the plurality of gate electrode layers 450 through at least one of metal lines 425 and contact plugs 481 to 489. Meanwhile, a source electrode of the ground select transistor GST may be connected to a common source line CSL and a drain electrode of the string select transistor SST may be connected to a bit line BL.

Figure 11:
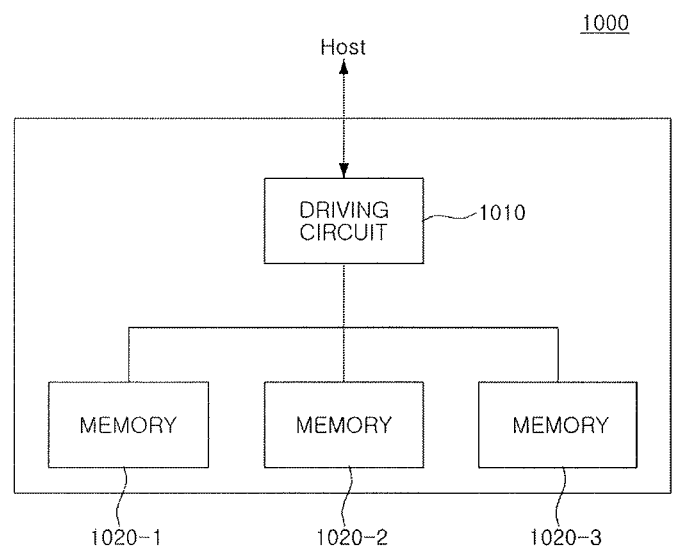
FIGS. 11 and 12 are block diagrams illustrating electronic devices including a memory device according to an exemplary embodiment of the present disclosure.
Figure 12:
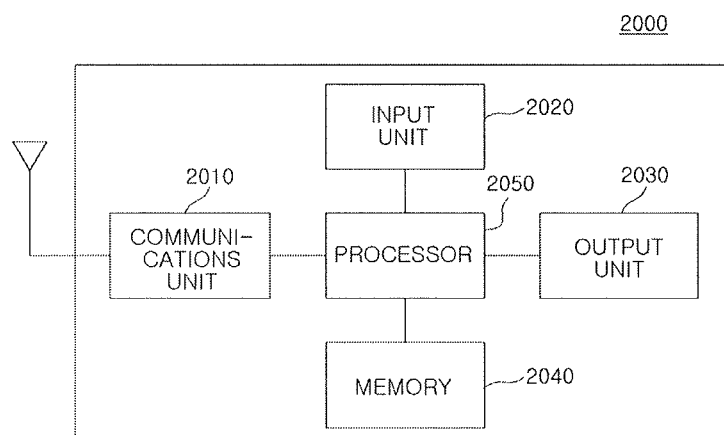

FIGS. 11 and 12 are block diagrams illustrating electronic devices including a memory device according to an exemplary embodiment of the present disclosure.

FIG. 11 is a block diagram illustrating a storage device including a memory device according to an exemplary embodiment of the present disclosure.

Referring to FIG. 11, a storage device 1000 according to this exemplary embodiment may include a controller 1010 communicating with a host HOST and memories 1020-1, 1020-2, and 1020-3 storing data. Each of the memories 1020-1, 1020-2, and 1020-3 may include at least one of the memory devices according to the exemplary embodiments described above with reference to FIGS. 1 through 6 and 10.

The host HOST communicating with the controller 1010 may be various electronic devices in which the storage device 1000 is installed. For example, the host HOST may be a smartphone, a digital camera, a desktop computer, a laptop computer, a media player, or the like. When a data write or read request is received from the host HOST, the controller 1010 may store data in the memories 1020-1, 1020-2, and 1020-3 or generate a command CMD to retrieve data from the memories 1020-1, 1020-2, and 1020-3.

As illustrated in FIG. 11, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having large capacity, such as a solid state drive (SSD), may be provided.

FIG. 12 is a block diagram illustrating an electronic device including a memory device according to an exemplary embodiment of the present disclosure.

Referring to FIG. 12, an electronic device 2000 according to this example embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, or the like. The wired/wireless communications module included in the communications unit 2010 may be connected to an external communication network based on various communication standards to transmit and receive data.

The input unit 2010, provided to allow a user to control an operation of the electronic device 2000, may include a mechanical switch, a touchscreen, a voice recognition module, and the like. Also, the input unit 2010 may include a mouse operating in a track ball or a laser pointer manner, or the like, or a finger mouse. In addition, the input unit 2020 may further include various sensor modules allowing the user to input data.

The output unit 2030 outputs information processed in the electronic device 2000 in an audio or video format, and the memory 2040 may store a program for processing and controlling of the processor 2050, data, or the like. The memory 2040 may include at least one of the memory devices according to the exemplary embodiments as described above with reference to FIGS. 1 through 6 and 10. The processor 2050 may deliver a command to the memory 2040 according to a necessary operation in order to store data to the memory 2040 or retrieve data therefrom.

The memory 2040 may be installed in the electronic device 2000 or communicate with the processor 2050 through a separate interface. In a case in which the memory 2040 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of respective components included in the electronic device 2000. The processor 2050 may perform controlling and processing related to an audio call, a video call, data communications, and the like, or may perform controlling and processing for multimedia playback and management. Also, the processor 2050 may process an input delivered from the user through the input unit 2020 and output corresponding results through the output unit 2030. Further, as described above, the processor 2050 may store data required for controlling the operation of the electronic device 2000 to the memory 2040 or retrieve the data therefrom.

As set forth above, according to exemplary embodiments of the present disclosure, a memory device has a peripheral circuit region below a cell region, in which a substrate providing the peripheral circuit region and a substrate providing the cell region may be provided as a substrate including single crystal silicon. Therefore, when epitaxial layers are formed using an SEG process, deviations in characteristics and height of the epitaxial layers may be reduced and the operational characteristics of memory cells included in the cell region may be enhanced.

While exemplary embodiments have been shown and described above, it will be apparent to those skilled in the art that modifications and variations could be made without departing from the scope of the present invention as defined by the appended claims.

What is claimed is:

1. A memory device, comprising:
 a peripheral circuit region including a plurality of circuit elements disposed on a first substrate, the first substrate including:
  a first region on which the plurality of circuit elements are disposed, and
  a second region extending from an upper surface of the first region in a direction perpendicular thereto;
 a cell region including at least one channel region extending from an upper surface of a second substrate disposed on the first substrate in a direction perpendicular to the upper surface of the second substrate, the second region of the first substrate extending from the upper surface of the first region to contact a lower surface of the second substrate; and
 a plurality of gate electrode layers and a plurality of insulating layers stacked on the second substrate to be adjacent to the at least one channel region,
 wherein at least a portion of the first substrate contacts the second substrate, and the first substrate and the second substrate provide a single substrate, and
 wherein a cross-sectional width of the upper surface of the second substrate is less than or equal to 30 times a cross-sectional width of the second region of the first substrate parallel to the upper surface of the second substrate, the first and second regions of the first substrate including a same material.

2. The memory device of claim 1, wherein the second region includes a plurality of second regions, a cross-section of each second region connected to the first region has a shape of an inverted T.

3. The memory device of claim 1, wherein a cross-sectional area of the upper surface of the second substrate is smaller than a cross-sectional area of the first region substantially parallel to the upper surface of the second substrate.

4. The memory device of claim 1, wherein at least one of the plurality of circuit elements is electrically connected to at least one of the plurality of gate electrode layers.

5. The memory device of claim 1, wherein each of the first substrate and the second substrate consists essentially of single crystal silicon, the first and second substrates being directly connected to each other to provide a single substrate including single crystal silicon.

6. The memory device of claim 1, wherein the second substrate and the first region of the first substrate are spaced apart and parallel to each other, the second region of the first substrate connecting the first and second substrates to each other and being perpendicular to each of the second substrate and the first region of the first substrate.

7. The memory device of claim 1, wherein a space is defined between the second substrate and the first region of the first substrate, the space being adjacent to the second region of the first substrate, and a peripheral region insulating layer being positioned in the space to contact directly at least each of the first and second regions of the first substrate.

8. A memory device, comprising:
- a peripheral circuit region including a plurality of circuit elements disposed on a first substrate, the first substrate including:
  - a first region on which the plurality of circuit elements are disposed, and
  - a second region extending from an upper surface of the first region in a direction perpendicular thereto;
- a cell region including at least one channel region extending from an upper surface of a second substrate disposed on the first substrate in a direction perpendicular to the upper surface of the second substrate, the second region of the first substrate extending from the upper surface of the first region to contact a lower surface of the second substrate;
- a plurality of gate electrode layers and a plurality of insulating layers stacked on the second substrate to be adjacent to the at least one channel region; and
- a peripheral region insulating layer disposed on the first region to fill a space between the first substrate and the second substrate, the second region of the first substrate extending through the peripheral region insulating layer to contact the lower surface of the second substrate,
- wherein at least a portion of the first substrate contacts the second substrate, and the first substrate and the second substrate provide a single substrate.

9. The memory device of claim 8, wherein the peripheral region insulating layer includes a high density plasma (HDP) oxide film.

10. The memory device of claim 8, wherein an upper surface of the peripheral region insulating layer is substantially parallel to the upper surface of the second substrate.

11. The memory device of claim 8, wherein an upper surface of the peripheral region insulating layer is substantially coplanar to the upper surface of the second substrate.

12. A memory device, comprising:
- a first substrate;
- a second substrate disposed on the first substrate;
- a plurality of transistors disposed on the second substrate and defining memory cells;
- a plurality of circuit elements disposed on the first substrate, the first substrate and the second substrate providing a single substrate including single crystal silicon; and
- a peripheral region insulating layer disposed between the first substrate and the second substrate to cover the plurality of circuit elements,
- wherein the first substrate includes:
  - a first region on which the plurality of circuit elements are disposed; and
  - a second region extending from an upper surface of the first region in a direction perpendicular thereto to contact a lower surface of the second substrate.

13. The memory device of claim 12, wherein a cross-sectional width of the second substrate is less than or equal to 30 times a cross-sectional width of the second region.

* * * * *